United States Patent [19]

Noguchi et al.

[11] Patent Number: 5,086,307
[45] Date of Patent: Feb. 4, 1992

[54] LIQUID JET RECORDING HEAD

[75] Inventors: Hiromichi Noguchi, Atsugi; Tadayoshi Inamoto, Machida; Megumi Saito, Kawasaki, all of Japan

[73] Assignee: Canon Kabushiki Kaisha, Tokyo, Japan

[21] Appl. No.: 655,195

[22] Filed: Feb. 13, 1991

Related U.S. Application Data

[63] Continuation of Ser. No. 497,094, Mar. 21, 1990, abandoned.

[51] Int. Cl.$^5$ .............................................. B41J 2/05
[52] U.S. Cl. ............................ 346/140 R; 430/286; 525/75; 525/76; 525/77; 525/79; 522/102
[58] Field of Search ............... 346/140; 522/102; 430/289; 525/75, 76, 77, 79

[56] References Cited

U.S. PATENT DOCUMENTS

| | | | |
|---|---|---|---|
| 4,417,251 | 11/1983 | Sugitani | 346/140 X |
| 4,509,063 | 4/1985 | Sugitani et al. | 346/140 |
| 4,657,631 | 4/1987 | Noguchi | 156/655 |
| 4,688,052 | 8/1987 | Inamoto | 346/140 |
| 4,688,053 | 8/1987 | Noguchi | 346/140 |
| 4,688,054 | 8/1989 | Inamoto | 346/140 |
| 4,688,055 | 8/1987 | Noguchi | 346/140 |
| 4,688,056 | 8/1987 | Noguchi | 346/140 |
| 4,775,445 | 10/1988 | Noguchi | 156/637 |
| 4,839,668 | 6/1989 | Sato | 346/140 |
| 4,839,669 | 6/1989 | Sato | 346/140 |

FOREIGN PATENT DOCUMENTS

| | | |
|---|---|---|
| 0307922 | 3/1989 | European Pat. Off. |
| 014277 | 2/1977 | Japan . |
| 014278 | 2/1977 | Japan . |
| 014279 | 2/1977 | Japan . |
| 283645 | 12/1986 | Japan . |
| 283646 | 12/1986 | Japan . |

*Primary Examiner*—Joseph W. Hartary
*Attorney, Agent, or Firm*—Fitzpatrick, Cella Harper & Scinto

[57] ABSTRACT

A liquid jet recording head comprising a cured product of an active energy-ray-curing resin composition as at least a part of its constitution, said composition comprises:

(A) a graft copolymerized polymer having a number average molecular weight of 5,000 or more and a weight average molecular weight of 50,000 or less which comprises a trunk chain composed mainly of structural units derived from at least one monomer (hereinafter referred to as "monomer (a)") selected from the group consisting of alkyl methacrylates, acrylonitrile and stylene and has graft chains having structural units derived from at least one monomer (hereinafter referred to as "Monomer (b)") selected from the group consisting of the monomers represented by the following formula x and other monomers presented by the formula y:

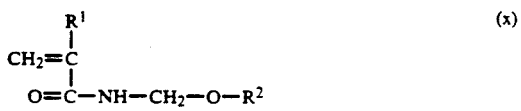

(x)

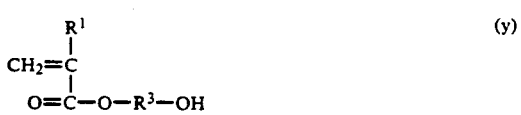

(y)

(B) a linear polymer having a number average molecular weight of 50,000 or more and a weight average molecular weight of 350,000 or less and having a glass transition temperature of 60° C. or more which comprises structural units derived from at least one monomer (herinafter referred to as "monomer (c)") and other structural units derived from at least one monomer (hereinafter called monomer (b')) selected from the group consisting of the monomers represented by the formula (x) and the monomers represented by the formula (y) provided that the monomer (a) and the monomer (b') may have either the same composition or different compositions;

(C) a resin esterificated at part of expoxy groups present in an epoxy resin containing at least one compound having two or more epoxy groups in one molecule with an unsaturated carboxylic acid; and (D) a polymerization initiator capable of generating a Lewis acid with irradiation of an active energy ray.

30 Claims, 8 Drawing Sheets

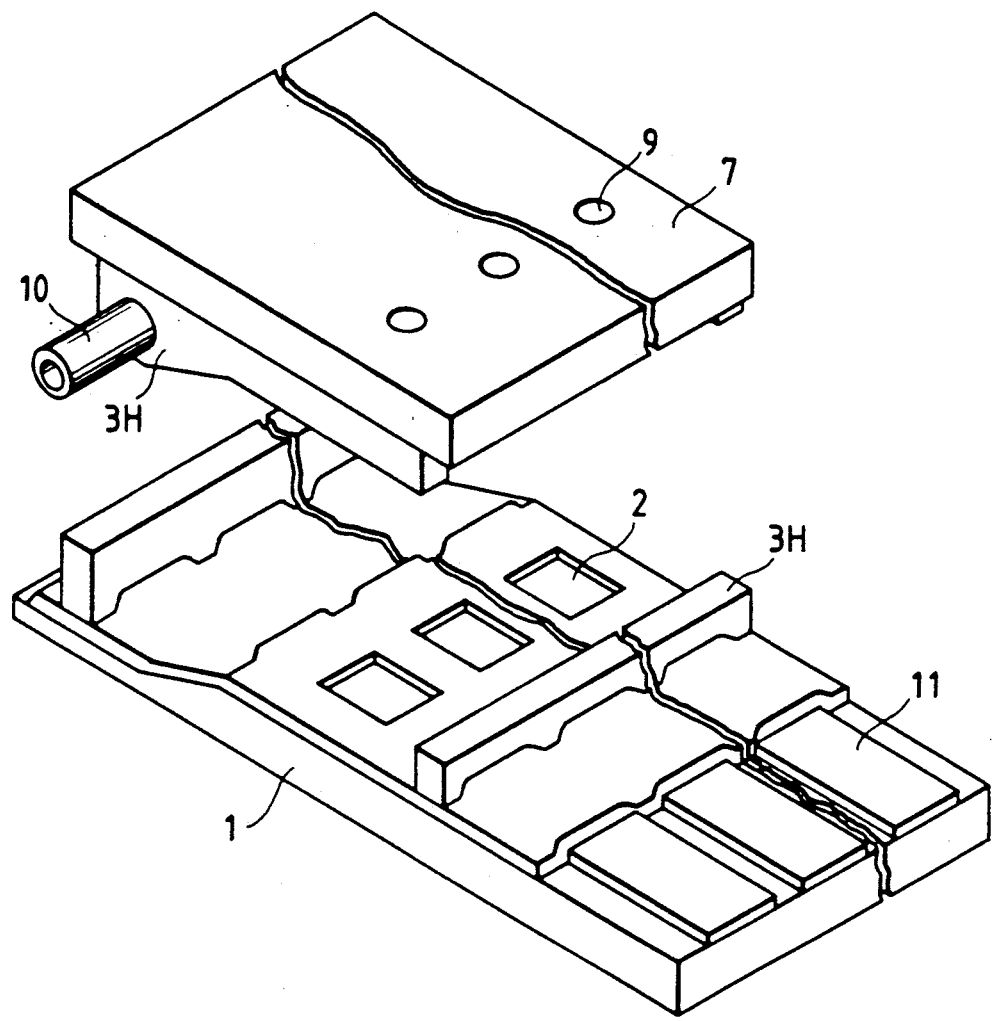
FIG. 9
FIG. 10A
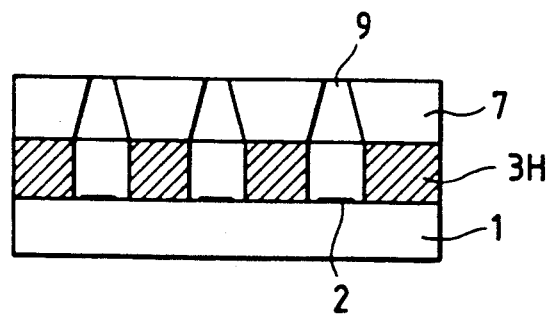
FIG. 10B
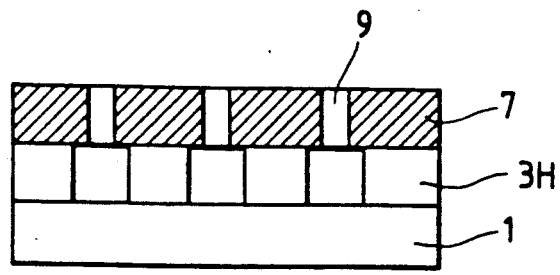

LIQUID JET RECORDING HEAD

This application is a continuation of application Ser. No. 497,094, filed Mar. 21, 1990 now abandoned.

BACKGROUND OF THE INVENTION

1. Field of the Invention

This invention relates to a liquid jet recording head and a recording apparatus by use thereof, particularly to a liquid jet recording head to be used for the liquid jet recording system which performs recording by discharging liquid for recording such as ink, and the like to attach it onto a recording medium such as paper, and a recording apparatus by use thereof.

2. Background Art

The liquid jet recording system which performs recording by discharging liquid for recording such as ink and the like to attach it onto a recording medium such as paper is extremely small to negligible extent in generation of noise during recording, and also enables high speed recording. Yet, it is attracting attention as the recording system capable of performing recording on a plain paper without requiring a special treatment such as fixing, and various types have been recently actively studied.

The recording head of the recording apparatus to be used in the liquid jet recording system is generally constituted by having an orifice (discharge opening) for discharging liquid for recording, a liquid path communicated with the orifice and having a portion at which the energy for discharging liquid for recording acts on the liquid for recording, and a liquid chamber for storing the liquid for recording to be supplied to the liquid path.

The energy for discharging the liquid for recording during recording is mostly generated by a discharge energy generating element of various types such as heat-generating element, a piezoelectric element arranged at a predetermined position of the portion (energy acting portion) where the discharge energy is acted on the liquid for recording constituting a part of the liquid path.

As the method for preparing a liquid jet recording head of such constitution, there may be included, for example, the method including the steps of forming a fine groove on a flat plate such as of glass, metal, and the like by cutting, etching, and the like and further forming a liquid path by bonding another appropriate plate to the flat plate having such groove formed thereon to form a liquid path, or the method including the steps of forming a wall of a photosensitive resin cured on a substrate having, for example, a discharge energy generating element arranged thereon by photolithographic step to provide a groove which becomes the liquid path on the substrate and bonding another flat plate (cover) to the grooved plate thus formed to form a liquid path (for example, U.S. Pat. No. 4,417,251.

Among these methods for preparation of liquid jet recording head, the latter method of employing a photosensitive resin can finely work the liquid path with better precision, and with better yield, as compared with the former method, and also bulk production can be realized more easily, and therefore it has the advantage that a liquid jet recording head with better quality and lower cost can be provided.

As the photosensitive resin for preparation of such a recording head, there have been used those which have been used for pattern formation in printing plate, print wiring, and the like, those known as the coating material or adhesive of the photocurable type to be used for glass, metal, ceramics, etc., and also primarily resins of the dry film type from the aspect of working efficiency.

In the recording head utilizing a cured film of a photosensitive resin for a part of the constitution, for obtaining excellent characteristics such as high degree of recording characteristic, durability and reliability, and the like, the photosensitive resin to be used is required to have such characteristics as:

(1) particularly excellent adhesion to the substrate, etc. as the cured film;

(2) excellent mechanical strength and durability when cured;

(3) excellent sensitivity and resolution during patterning by use of pattern exposure.

Whereas, few of the known photosensitive resins which have been employed for formation of liquid jet recording heads up to date fully satisfied all of the characteristics as mentioned above under the present situation.

As the photosensitive resin for recording heads, for example, those employed for pattern formation in printing plate, print wiring, etc., although excellent in sensitivity and resolution, are not satisfactory in such demands as adhesion and close contact with glass, ceramics, plastic films, etc. used as a substrate in most cases, and also sometimes insufficient in mechanical strength or durability when cured. For this reason, in the step of preparing a recording head or as accompanied with use of a recording head, there may sometimes ensue such problem that deformation, peel-off from the substrate, damage of the resin cured film which may be a cause for remarkable damage of the reliability of the recording head such as lowering in recording characteristics by inteference of the flow of the liquid for recording within the liquid path, or making the liquid discharge direction unstable.

On the other hand, those known as the photocurable type coating material or adhesive to be used for glass, metal, ceramics, etc., although having such advantages that they are excellent in close contact or adhesion with the substrates comprising these materials, and also that sufficient mechanical strength and durability are obtained when cured, are not satisfactory in the demands of sensitivity and resolution in most cases, whereby an exposure device of higher intensity or prolonged exposure operation are required. Also, in their characteristics, no highly precise high density pattern can be hardly obtained with good resolution, and therefore such resins have the problem that they are not suitable for recording heads for which fine precise working is particularly required.

Also, in the photosensitive resin compositions utilized for various uses of the prior art, adhesion with metal, etc. has been improved by addition of various additives such as heterocyclic compounds having complex forming ability with metals, etc., or coupling agents, etc. into the photosensitive resin composition (Japanese Patent Publication Nos. 51-5934, 58-24035, etc.). However, this method had the problem that the above additive aids, etc. caused such phenomena as oxidation and corrosion of the composition, etc. after elapse of a long term.

On the other hand, for the purpose of obtaining a cured composition having sufficient adhesion without addition of such additive aids, a polymeric substance comprising a graft copolymer having polar group in the branched chains is disclosed in Japanese Laid open Patent Application Nos. 61-283645, 61-283646. The active energy-ray-curing resin composition containing the polymeric substance (graft copolymerized polymer) disclosed in the applications has the advantage that improvement of adhesion, further improvement of durability of the coating can be realized without relying on additive aids, etc.

However, in this composition, there still remained the problem that difficulty is accompanied with the molecular design of the polymeric substance (graft copolymerized polymer). More specifically, there is generally accompanied technical difficulty in synthesizing a graft copolymer so that its whole weight average molecular weight may become a suitable desired molecular weight over a wide range (about 50,000 to 350,000) while maintaining the molecular weight of the graft chain and its content at constant levels.

Shortly speaking, for making good the developing characteristics during pattern formation, namely dissolving rate of the unpolymerized portion, swellability of the polymerized portion, and sensitivity, sharpness of pattern, resolution as the results of them, the average molecular weight of the polymeric substance must not be too small. In the graft copolymerized polymer, it is accompanied with difficulty from the point of steric hindrance in the synthetic technique at the present time to obtain an average molecular weight in conformity with the abovementioned object by bonding a large number of graft chains having enough lengths to obtain effective adhesion to the trunk chain of a relatively larger molecular weight.

In other words, if the average molecular weight of the polymeric substance is too low, the developing characteristics of the pattern forming material by use thereof, namely dissolving rate of the unpolymerized portion, swellability of the polymerized portion, and sensitivity, sharpness of pattern, control of resolution are limited to some extent.

Thus, the photosensitive resin composition to be used as the constituent material of a liquid jet recording head (ink jet recording head) is required to have characteristics of extremely high performance.

Specifically, the characteristics demanded for the photosensitive resin composition may be mentioned as follows:

(1) The composition should be such that when formed into a cured film, the film is completely or substantially free from dissolution into ink, and should not cause problems such as generation of a foreign matter which may cause clogging of discharge opening or liquid path or change in discharge characteristics by change in ink properties;

(2) The composition should be such that when formed into a cured film, the film causes no lowering in strength or change in dimensions as the structural material such as swelling, peel-off, generation of cracks by penetration of ink;

(3) The composition should be such that when applied as a cured film to a recording head in which particularly, heat energy is utilized as the liquid discharging energy, there occurs no deformation of the shape, etc. by the pressure for liquid discharging and the thermal shock and the like.

This is because the photosensitive resin composition (or its cured product) is constantly in contact with ink (water-soluble organic solvents of high polarity are used therein in most cases), whereby the problem will readily occur that residual soluble components are dissolved into ink.

Also, lowering in strength, change in dimensions as the structural material, in addition to giving great restrictions in design of ink, add great restrictions in durability, design of the recording head itself.

Further, due to the synergetic action of heat and pressure, there may be sometimes generated such problems as deformation, etching, etc. as the structural material.

SUMMARY OF THE INVENTION

The present invention has been accomplished in view of the problems as described above, and its object is to provide a recording head by use of an active energy-ray-curing resin composition, having sufficient adhesion without addition of additive aids, etc., excellent developing characteristics during pattern formation, and also characteristics readily controlled so as to give good characteristics as the constituent member of a liquid jet recording head, which is inexpensive and highly precise, high in reliability and excellent in durability, and a recording apparatus by use thereof.

Another object of the present invention is to provide a liquid jet recording head having a constitution with a liquid path finely worked with good precision and with good yield, and a recording apparatus by use of the head.

Still another object of the present invention is to provide a liquid jet recording head having high reliability and excellent durability also when formed into a multi-orifice, and a recording apparatus by use of the head.

Still another object of the present invention is to provide a recording head by use of an active energy-ray-curing resin composition which, when formed into a cured film, is completely or substantially free from dissolution into ink, and does not cause problems such as generation of a foreign matter which may cause clogging of discharge opening or liquid path or change in discharge characteristics by change in ink properties, and a recording apparatus by use of the head.

Still another object of the present invention is to provide a recording head by use of an active energy-ray-curing resin composition which, when formed into a cured film, causes no lowering in strength or change in dimensions as the structural material such as swelling, peel-off, generation of cracks by penetration of ink as the cured film, and a recording apparatus by us of the head.

Still another object of the present invention is to provide a recording head by use of an active energy-ray-curing resin composition which, when applied as a cured film to a recording head in which particularly, heat energy is utilized as the liquid discharging energy, there occurs no deformation of the shape, etc. by the pressure for liquid discharging and the thermal shock and the like, and a recording apparatus by use of the head.

Still another object of the present invention is to provide a liquid jet recording head comprising a cured product of an active energy-ray-curing resin composition as at least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer (hereinafter referred to as "monomer (a)") selected from the group consisting of alkyl methacrylates, acrylonitrile and styrene and has graft chains having structural units derived from at least one monomer (hereinafter referred to as "monomer (b)") selected from the group consisting of the monomers represented by the following formula x and other monomers presented by the formula y:

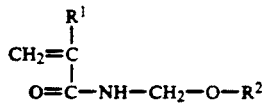

(x)

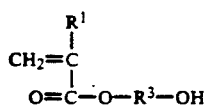

(y)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula: $-CH_2)_nO-CH_2)_m$ (wherein $2 \leq m+n \leq 6$, $n \neq 0$ and $m \neq 0$), or a phenylalkyl group represented by the formula:

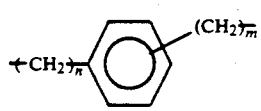

, (wherein $2 \leq m+n \leq 4$, or the case where $n=0$ or $m=0$ is contained), added to said trunk chain;

(B) a linear polymer having a number average molecular weight of 50,000 or more and a weight average molecular weight of 350,000 or less and having a glass transition temperature of 60° C. or more which comprises structural units derived from at least one monomer (hereinafter referred to as "monomer (c)") selected from the group consisting of methyl methacrylate, ethyl methacrylate, isobutyl methacrylate, t-butyl methacrylate, benzyl methacrylate, acrylonitile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (hereinafter called monomer (b')) selected from the group consisting of the monomers represented by the formula (x) and the monomers represented by the formula (y) provided that the monomer (a) and the monomer (b') may have either the same composition or different compositions;

(C) a resin esterificated at part of epoxy groups present in an epoxy resin containing at least one compound having two or more epoxy groups in one molecule with an unsaturated carboxylic acid; and (D) a polymerization initiator capable of generating a Lewis acid with irradiation of an active energy ray.

Still another object of the present invention is to provide a liquid jet recording apparatus comprising a liquid jet recording head having a discharge opening for discharging recording liquid, a driving circuit for driving said recording head and platen, said liquid jet recording head comprising a cured product of an active energy-ray-curing resin composition as at least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer (hereinafter referred to as "monomer (a)") selected from the group consisting of alkyl methacrylates, acrylonitrile and styrene and has graft chains having structural units derived from at least one monomer (hereinafter referred to as "monomer (b)") selected from the group consisting of the monomers represented by the following formula x and other monomers presented by the formula y:

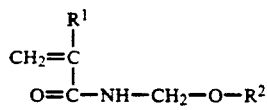

(x)

(y)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula: $-CH_2)_nO-CH_2)_m$ (wherein $2 \leq m+n \leq 6$, $n \neq 0$ and $m \neq 0$), or a phenylalkyl group represented by the formula:

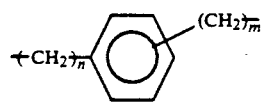

(wherein $2 \leq m+n \leq 4$, or the case where $n=0$ or $m=0$ is contained), added to said trunk chain;

(B) a linear polymer having a number average molecular weight of 50,000 or more and a weight average molecular weight of 350,000 or less and having a glass transition temperature of 60° C. or more which comprises structural units derived-from at least one monomer (hereinafter referred to as "monomer (c)") selected from the group consisting methyl methacrylate, ethyl methacrylate, isobutyl methacrylate, t-butyl methacrylate, benzyl methacrylate, acrylonitile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (hereinafter called monomer (b')) selected from the group consisting of the monomers represented by the formula (x) and the monomers represented by the formula (y) provided that the monomer (a) and the monomer (b') may have either the same composition or different compositions;

(C) a resin esterificated at part of epoxy groups present in an epoxy resin containing at least one compound having two or more epoxy groups in one molecule with an unsaturated carboxylic acid; and (D) a polymerization initiator capable of generating a Lewis acid with irradiation of an active energy ray.

Next, the formulation ratio of the respective components as described above may be suitably selected depending on the use site or the use purpose of the active energy-ray-curing resin composition containing these components in the liquid jet recording head of the present invention.

BRIEF DESCRIPTION OF THE DRAWINGS

FIGS. 7A, 7B, 7C, 7D, 7E, 7F, 7G, 7H, 10A and 10B are schematic lateral sectional views at the surface vertical to the liquid paths of the recording head showing the portions in which the resin cured film is used;

FIGS. 8A and 8B, and FIG. 9 are schematic diagrams showing another constitution Of &he recording head.

DESCRIPTION OF THE PREFERRED EMBODIMENTS

Figure 1A:
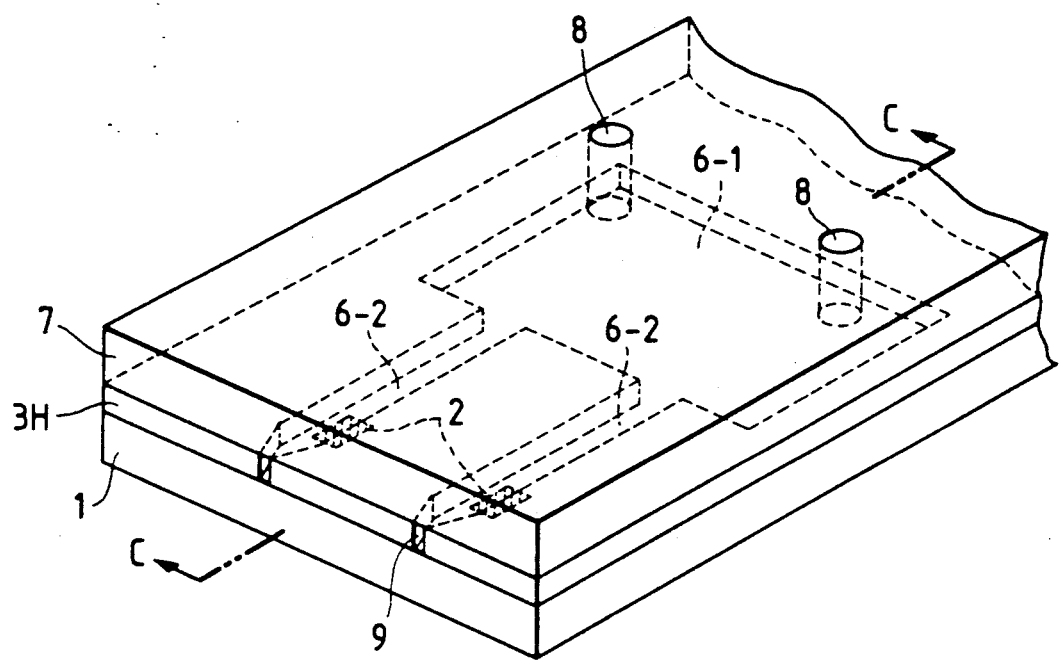
FIGS. 1A, 1B, 2, 3A, 3B, 4, 5A, 5B, 6A and 6B are schematic diagrams for illustration of the liquid jet recording head of the present invention and a method for preparation thereof.

The liquid jet recording head can take various constitutions as desired, but the cured product of the resin composition as mentioned above is used as at least a part of its constitution.

Referring now to the drawings, an example of the liquid jet recording head of the present invention is described in detail.

Figure 1B:
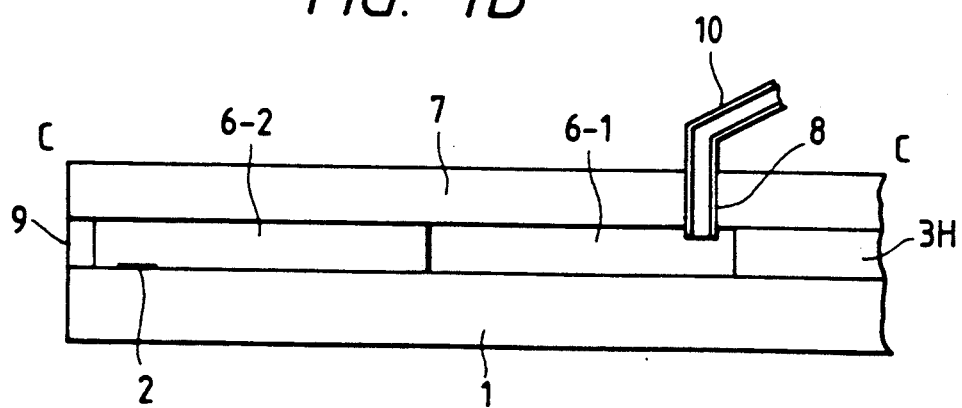

FIG. 1 is a preferable example of the liquid jet recording head of the present invention, FIG. 1A being a perspective view of its principal portion, FIG. 1B a sectional view out along the line C—C in FIG. 1A.

The liquid jet recording head comprises basically a substrate 1, a liquid path wall 3H comprising a resin cured film patterned to a predetermined shape and a cover 7 laminated on the liquid path wall 3H, and by these members are formed an orifice 9 for discharging liquid for recording, liquid paths 6-2 communicated to &he orifice and having a portion at which the energy for discharging the liquid for recording acts on the liquid for recording and a liquid chamber 6-1 for storing the liquid for recording to be fed to the liquid paths. Further, to the thru-holes 8 provided at the cover are bonded feeding pipes for feeding the liquid for recording to the liquid chamber 6-1 externally of the recording head. In FIG. 1A, the feeding pipe 10 is omitted. Of course, it may be also directly communicated through the thru-hole 8 to the inner portion of the vessel for housing the liquid for recording.

During recording, the energy for discharging the liquid for recording is generated by applying a discharge signal as desired on the discharge energy generating elements 2 of various types such as heat-generating element, piezoelectric element, etc. arranged at predetermined positions of the portion where discharging energy is permitted to act on the liquid for recording constituting a part of the liquid path 6-2 through the wiring (not shown) connected to these elements.

The substrate I constituting the recording head of the present invention comprises glass, ceramics, plastic or metal, etc.. and the generating elements 2 are arranged in desired number at predetermined positions. In the example in FIGS. 1A and 1B, two generating elements are provided, but the number and arrangement of the heat-generating elements may be suitably determined depending on the predetermined constitution.

The cover 7 comprises a flat plate of glass, ceramics, plastic or metal, etc., which is bonded onto the liquid path wall 3H by the bonding method by fusion or by use of an adhesive, and the thru-holes 8 for connecting the feeding pipes 10 are provided at predetermined positions.

In the recording head, the resin cured film patterned to a predetermined shape constituting the wall 3H of the liquid path 6-2 and the liquid chamber 6-1 is obtained by subjecting the layer comprising &he active energy-ray-curing resin composition including the constituent components (A) to (D) as described above provided on the substrate 1 or on the cover 7 to patterning according to the photolithographic steps.

Having described above about an example using a cured film of the resin composition for the constitution of the liquid path wall 3H, the cured film (cured product) of the resin composition can be suitably utilized for other portions of the recording head.

Figure 7A:
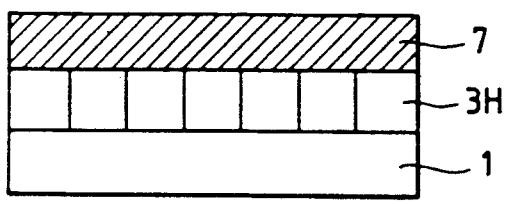
Figure 7E:
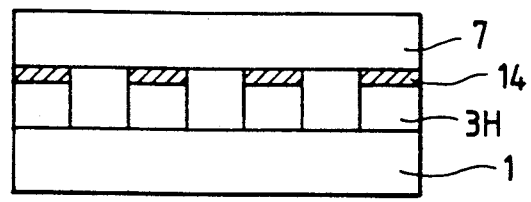
Figure 7B:
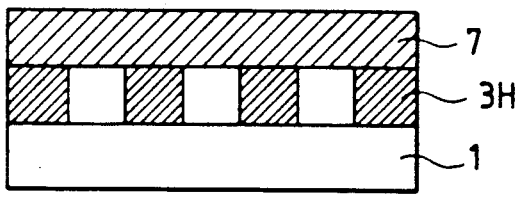
Figure 7F:
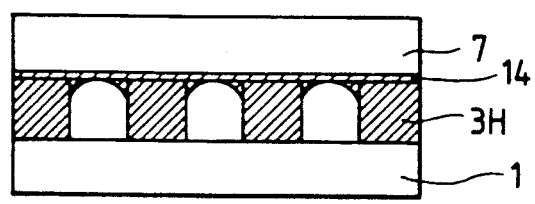
Figure 7C:
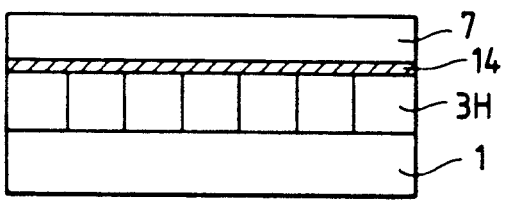
Figure 7G:
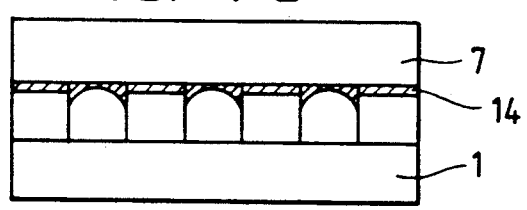
Figure 7D:
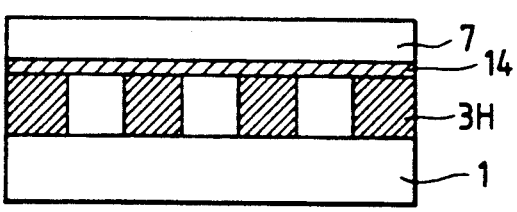
Figure 7H:
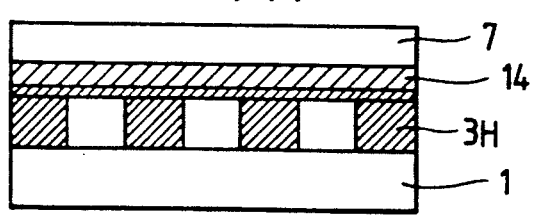

For example, as shown in FIGS. 7A to 7H represented as a partial section of a recording head vertical to the liquid paths, there can be mentioned utilization of:

1. as the cover 7 [FIG. 7A];
2. as the liquid path wall 3H and the cover 7 (in this case, the liquid path wall 3H and the cover 7 may be formed integrally, or may be also formed separately and then bonded) [FIG. 7B];
3. as the adhesive layers 14 between the liquid path wall 3H and the cover 7 formed from various resins, etc. [FIGS. 7C, 7E and 7G];
4. as the liquid path wall 3H and the adhesive layer 14 between the liquid path wall 3H and the cover 7 [FIGS. 7D and 7F]
5. as the liquid path wall 3H and the adhesive layers 14 between the liquid path wall 3H and the cover 7 (two-layer constitution) [FIG. 7H], or a combination of them. Among the above constitutions, for formation of the constitutions of FIGS. 7A to 7E, 7H and the liquid path wall 3H in FIG. 7F, those of the dry film type can be suitably used, while for the adhesive layer 14 in FIGS. 7F and 7G, those of the type which is used in liquid state and cured may be suitably used.

Figure 8A:
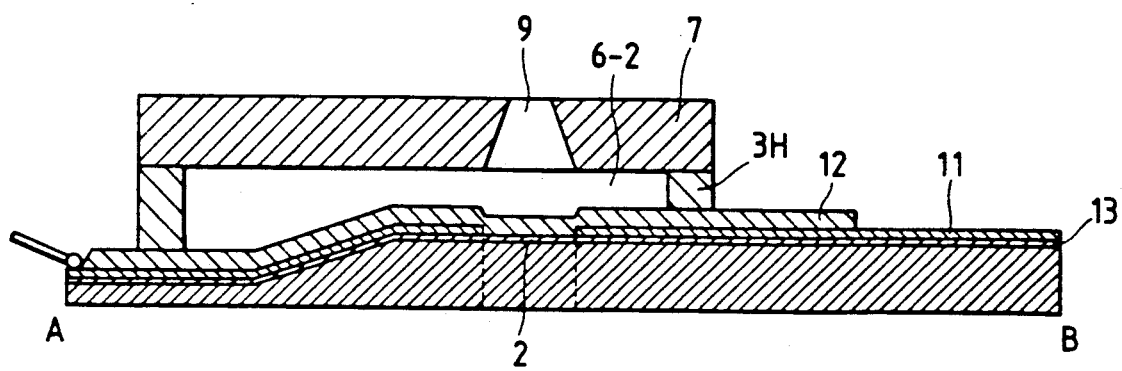
Figure 8B:
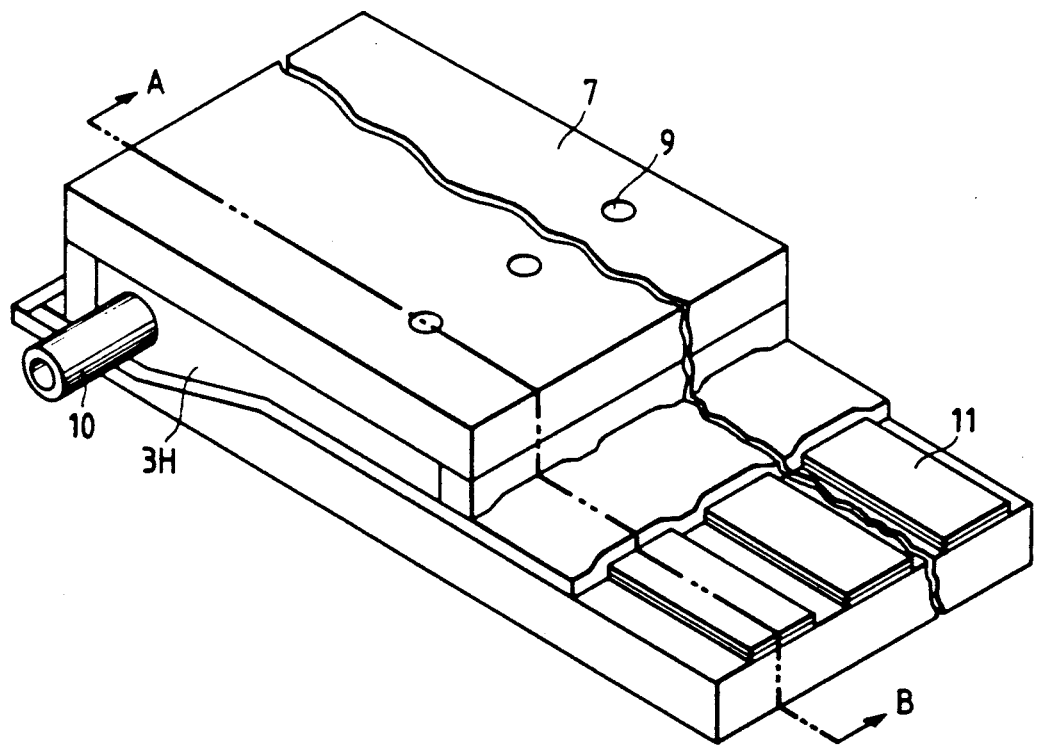

Further, the recording head of the present invention may be also one having a structure for discharging liquid in the direction vertical to the liquid path (6-2) shown in FIGS. 8A and 8B and FIG. 9, and in that case, for example, the cured film of the resin composition can be suitable utilized for the same portions as shown in FIG. 7, such as the portions in FIGS. 10A and 10B.

In the following, the active energy-ray-curing resin composition comprising the constituents (A) to (D) as mentioned above to be used in the constitution of the recording head of the present invention are described.

The resin composition, particularly when formed into a cured film, has excellent characteristics as a constituent member of a liquid jet recording head such that it has good adhesion to various members such as a substrate, etc. comprising glass, plastic, ceramics, etc., and is excellent also in resistance to the liquid for recording such as ink and mechanical strength, and yet can form a pattern which is precise and of high resolution by patterning with an active energy ray.

Further, the resin composition can be also used as the dry film, and also in that case the excellent characteristics as mentioned above can be exhibited.

For the formation of the trunk chain of the graft copolymerized copolymer (A) contained in the above resin composition, the abovementioned monomer component (a) is used as the main component.

For the monomer to be used for constitution of the graft chain, in addition to the abovementioned monomer component (b), it is necessary to jointly use the following polar monomer, if necessary.

(I) Acrylic monomers containing amino group or alkylamino group,
(II) acrylic or vinyl monomers containing carboxyl group,
(III) N-vinylpyrolidone or its derivatives, and
(IV) Vinylpyridine or its derivatives.

In addition, it is possible to use a hydrophobic monomer as the component of the copolymerization in an amount of about 25 mol % or less.

The above graft copolymerized polymer (A) to be used in this invention can be prepared according to the known methods, specifically by various methods as disclosed in "Base and Application of Polymer Alloy" p.10–35 (edited by Polymer Society of Japan, published by Tokyo Kagaku Dojin K.K., 1981). Examples of those methods include (1) the chain transfer method, (2) the method by use of radiation, (3) the oxidation polymerization method, (4) the ion graft polymerization method and (5) macromonomer method.

In accordance with any of these methods, the above graft copolymerized polymer (A) constructing the composition according to the present invention can be properly prepared using the foregoing monomers (a) and (b) under proper polymerization conditions which make it possible to obtain a desired graft copolymerized polymer having a number average molecular weight of 5,000 or more and a weight average molecular weight of 50,000 or less.

Among the above methods of (1) to (5), the methods of (4) and (5) are preferred since the lengths of the graft chains of the graft copolymer (A) may be easily uniformed. And, the macromonomer method of (5) is most preferred in view that it is advantageous in design of materials.

The foregoing linear polyer (B) may be properly prepared in accordance with the conventional polymerization method using the foregoing monomer (c) as the main component and also using the foregoing monomer (b) under properly selected polymerization conditions which permit production of a linear polymer having a number average molecular weight of 50,000 or more and a weight average molecular weight of 350,000 or more and having a glass transition temperature of 60° C. or more. Further, it is preferred to add the monomer (b) in an amount of 5 to 30 mol % for the following reasons. That is, when more than 30 mol % of the monomer (b) is incorporated into a linear polymer to be obtained, there are disadvantages that the polar group content in a cured film will be undesirably heightened and because of this, any improvement cannot be attained in its adhesiveness with a substrate, and in addition to this, the resulting cured film will be such that is poor in the resistance to water. On the other hand, when less than 5 mol % of the monomer (b) is incorporated into a linear polymer to be obtained, not only the adhesiveness with substrate but also the effects of a cured film as the binder will be insufficient.

In order to afford a high glass transition temperature and to contribute in hightening the resistance to water for the resulting cured film, among the foregoing monomers (c), methylmethacrylate, isobonylmethacrylate, isobonylacrylate, tricyclodecaneacrylate or tricyclodecanemethacrylate is most desired.

The foregoing epoxy resin (C) which comprises at least one compound having two or more epoxy groups in one molecule in which part of the epoxy groups being esterificated with an unsaturated carboxylic acid (hereinafter referred to as .half-esterificated epoxy resin (C)") to be used in the resin composition according to this invention is a component which permits the said resin composition to exhibit high sensitivity and satisfactory curability in the presence of the foregoing polymerization initiator (D) with the action of an active-energy-ray and in addition thereto, imparts better adhesiveness with a substrate, water resistance, resistance against chemicals, dimensional stability, etc., to the resulting cured film constituted with the said resin composition, when it is formed by applying the said composition in liquid state on a substrate of glass, plastics, ceramics, etc., followed by curing, or when it is used in the form of a dry film adhered on a substrate.

This half-esterificated resin (C) may be prepared in accordance with any of the conventional methods. For example, an epoxy resin comprising at least one compound having two or more epoxy groups in one molecule is reacted with an unsaturated carboxylic acid in a predetermined amount in the presence of an addition reaction catalyst and a polymerization-inhibitor and in the presence of a solvent or in the absence thereof at a temperature of 80° to 120° C. to thereby esterificate part of the epoxy groups present in the said epoxy resin.

Examples of the above epoxy resin comprising at least one compound having two or more epoxy groups in one molecule, which can be used for the preparation of the half-esterified epoxy resin (C), include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula I:

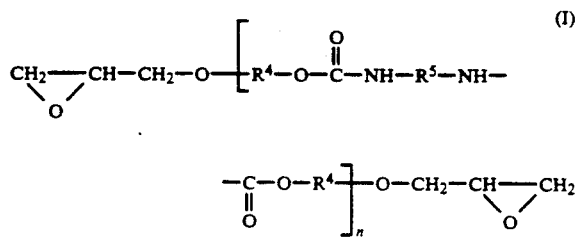

(wherein $R^4$ represents an alkyl group or an oxyalkyl group, $R^5$ represents

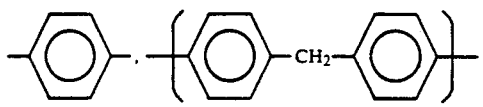

or an alkyl group), and mixtures of two or more of them.

Specific examples of these polyfunctional epoxy resins include those as mentioned in the following. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.), and Epicrone 800 (trade name, produced by Dainippon Ink Kagaku K.K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438, and 439 (trade names, produced by Dow Chemical Co.),etc. The alicyclic epoxy resin may be, for example, Araldite Cy-175, -176, -179, -182, -184, -192 (trade names, produced by Ciba Geigy Co.), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.) Etc. The polyglycidyl ether of aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trimethylolpropane triglycidyl ether, diglycidyl ether of hydrogenated bisphenol A, 2.2-dibromoneopentylglycol diglycidyl ether, etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 mols of alkylenoxide, a diglycidyl ether of an addition product of bisphenol S added with 2 to 16 mols of alkyleneoxide.

As the unsaturated carboxylic acid to be used for the esterification of part of the epoxy groups present in the foregoing epoxy resin (this esterification will be hereinafter called "half-esterification"), various unsaturated carboxylic acids may be selectively used.

However, in order to add a desired curability with the action of an active energy ray to the resulting resin composition in this invention, it is desired to use such a monobasic unsaturated carboxylic acid that has at least an acrylic or methacrylic vinyl group on one end of the molecule and a carboxyl group on the other end thereof.

Representative examples of such unsaturated carboxylic acid may include acrylic acid and methacrylic acid, and other than these, a monoester compound obtained by reacting a dicarboxylic acid with a (metha)acrylic acid ester having a hydroxyl group.

As the above dicarboxylic acid, there can be mentioned phthalic acid, isophthalic acid, terephthalic acid, oxalic acid, malonic acid, succinic acid, glutaric acid, adipic acid. pimelic acid, suberic acid, azelaic acid, sebacic acid, isosebacic acid, tetrahydrophthalic acid and anhydrides of these compounds.

As the above methacrylic acid ester having a hydroxyl group, there can be mentioned 2-hydroxypropyl(meth)acrylate, 3-chloro-2-hydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, etc.

As the addition reaction catalyst to be used in the half-esterification reaction of the foregoing epoxy resin, there can be mentioned metal halides such as zinc chloride or lithium chloride: sulfide compounds such as dimethyl sulfide or methylphenyl sulfide: sulfoxide compounds such as dimethyl sulfoxide or methylethyl sulfoxide: tertiary amine compounds such as N,N-dimethylaniline, pyridine, triethylamine, benzyldimethylamine, hydrochlorides of these amine compounds or oxalates of these amine compounds: tetraammonium salt compounds such as tetramethylammonium chloride, trimethydodecylbenzylammonium chloride or triethylbenzylammonium chloride: sulfonic acids such as paratoluene sulfonic acid: and mercaptan compounds such as ethyl mercaptan or propyl mercaptan.

As the foregoing polymerization-inhibitor to be used in the half-esterification reaction of the foregoing epoxy resin, there can be mentioned hydroquinone, alkyl- or aryl-substituted hydroquinone, tertiary butyl catechol. pyrogallol, naphthylamine, $\beta$-naphthol, cuprous chloride, 2.6-ditertiarybutyl-p-cresol. phenothiazine, N-nitrosodiphenylamine and nitrobenzene.

And as the solvent to be used in the foregoing half-esterification reaction of the foregoing epoxy resin, there can be mentioned toluene xylene methyl isobutyl ketone methyl ethyl ketone, ethyl acetate, butyl acetate, isobutyl acetate, etc.

The amount of the epoxy resin and that of the carboxylic acid to be employed in the half-esterification reaction are properly determined such that the ratio of the epoxy groups in the epoxy resin to the carboxylic groups of the carboxylic acid becomes to lay preferably in the range of from 1:0.3 to 1:0.7, and more preferably, in the range of from 1:0.45 to 1:0.55.

In the case where the ratio of the epoxy groups esterificated with the unsaturated carboxylic acid in a half-esterificated epoxy resin to be prepared is higher than the above range, it is difficult to obtain an objective resin composition accompanied with a desired resistance against chemicals and a desired dimensional stability respectively caused by the foregoing epoxy resin (C). On the other hand, in the case where the aforesaid ratio is lower than the above range, it is also difficult to obtain an objective resin composition which exhibits a high resolution and a sufficient curability respectively based on the methacrylic ester group with the action of said active energy ray.

As mentioned above, the active energy-ray-curing resin composition used in the present invention has a high sensitivity based on the above half-esterificated epoxy resin (C), a desired curability to an active energy ray based on the acrylic ester group, and a desired heat curability based on the epoxy group.

Because of this, a cured film obtained by curing the said resin composition with irradiation of an active energy ray then heating at a temperature of 80° C. or more for a period of 10 minutes to 3 hours becomes such that is accompanied with a desired resistance against chemicals and a desired dimensional stability respectively caused by the half-esterificated epoxy resin (C).

The foregoing polymerization initiator (D) capable of generating a Lewis acid with irradiation of an active energy ray to be used in the active energy-ray-curing resin composition in this invention is a component for curing the half-esterificated epoxy resin (C) as mentioned above with the action of the Lewis acid, which permits the said resin composition of exhibit a high sensitivity and desired curability to an active energy ray. As such a polymerization initiator (D), there may be preferably used, for example, aromatic onium salt compounds having photosensitivity containing an element belonging to the groups VIa as disclosed in Japanese Patent Publication No. 52-14278 or aromatic onium salt compounds having photosensitivity containing an element belonging to the group Va as shown in Japanese Patent publication No. 52-14279 or aromatic halonium salts having photosensitivity as shown in Japanese Patent publication No. 52-14277. These aromatic onium salt compounds or aromatic halonium salts all have the characteristic of curing the half-esterificated epoxy resin (C) by releasing a Lewis acid with irradiation of an active energy ray.

The aromatic onium salt compounds having photosensitivity of the element belonging to the group VIa or the group Va may include typically the compounds of the following formula II:

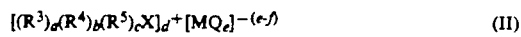
(II)

(wherein $R^3$ is a monovalent organic aromatic group, $R^4$ is a monovalent organic aliphatic group selected from alkyl groups, cycloalkyl groups and substituted alkyl groups, $R^5$ is a polyvalent organic group for constituting heterocyclic or fused ring structure selected from aliphatic groups and aromatic groups, X is an element belonging to the group VIa selected from sulfur, selenium and tellurium or an element belonging to the group Va selected from nitrogen, phosphorus, arsenic, antimony and bismuth, M is a metal or metalloid and Q is halogen, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and d=e-f).

On the other hand, the photosensitive aromatic halonium salt may be exemplified by the following formula III:

(III)

(wherein $R^6$ is a monovalent aromatic organic group, $R^7$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to k-1, j is an integer of 2 to 7 which is equal to the valence of M, and k is an integer greater than one but up to 8).

Specific examples of the photosensitive aromatic onium salt compounds containing an element belonging to the group VIa or the group Va may include the photosensitive aromatic onium salts of the elements belonging to the group VIa as shown below:

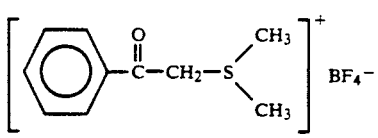

a)

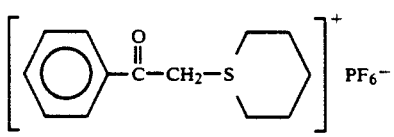

b)

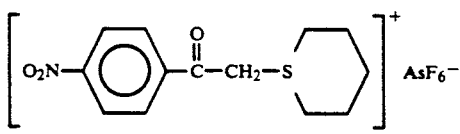

c)

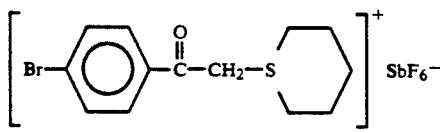

d)

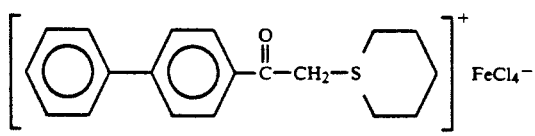

e)

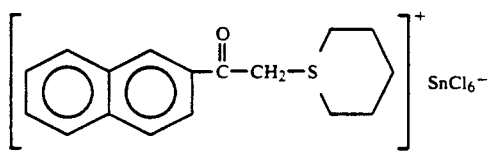
f)
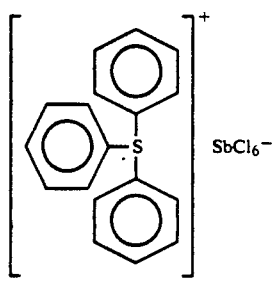
g)
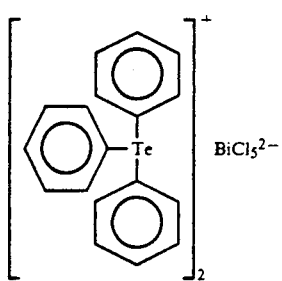
h)
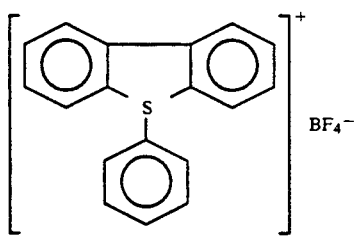
i)
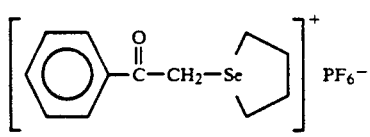
j)
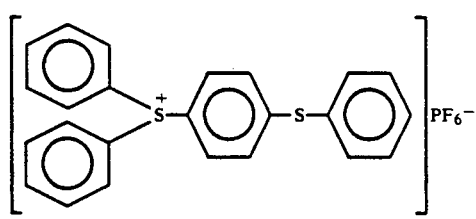
k)
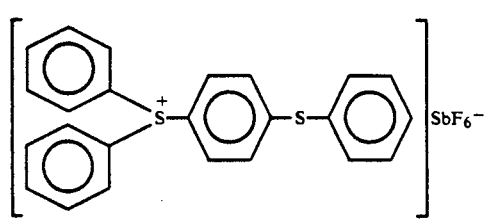
l)

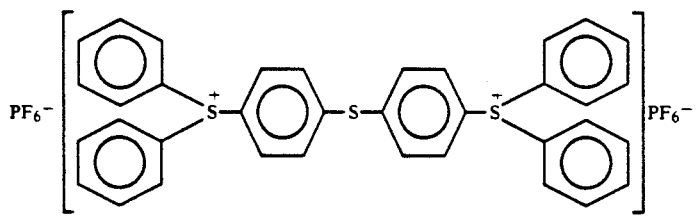 m)
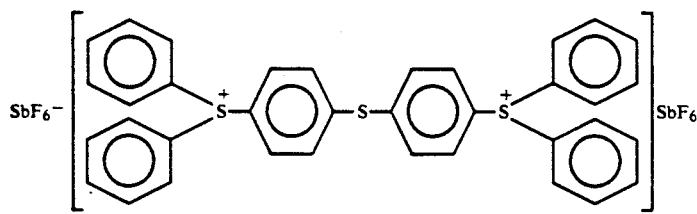 n)
and photosensitive aromatic onium salts of the elements belonging to the group Va as shown below:
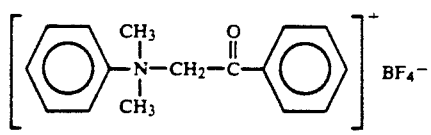 1)
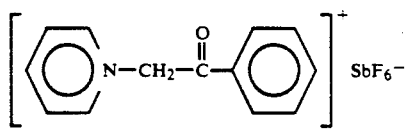 2)
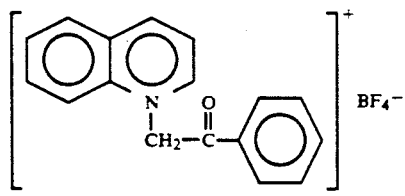 3)
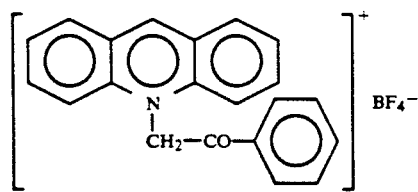 4)
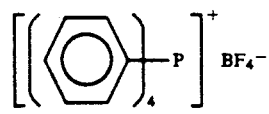 5)
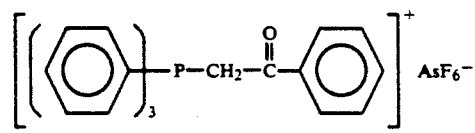 6)
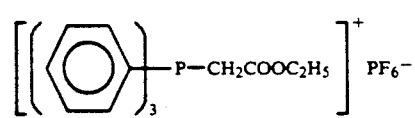 7)
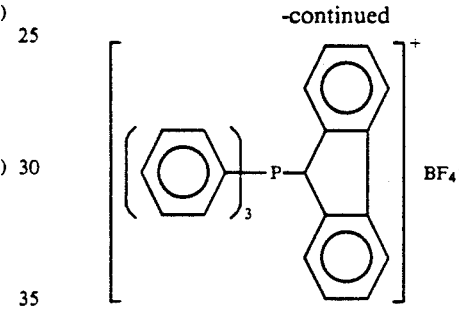 8)
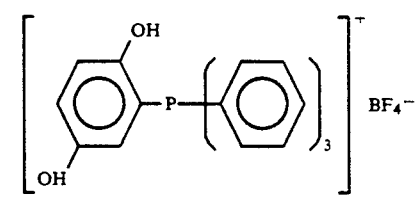 9)
 10)
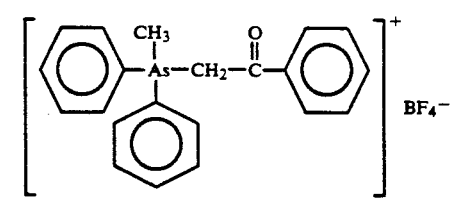 11)
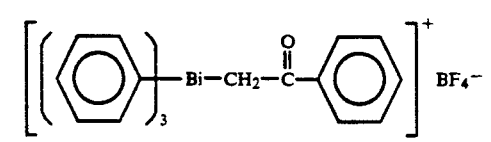 12)
Specific examples of the photosensitive aromatic halonium salts include, for example:

-continued

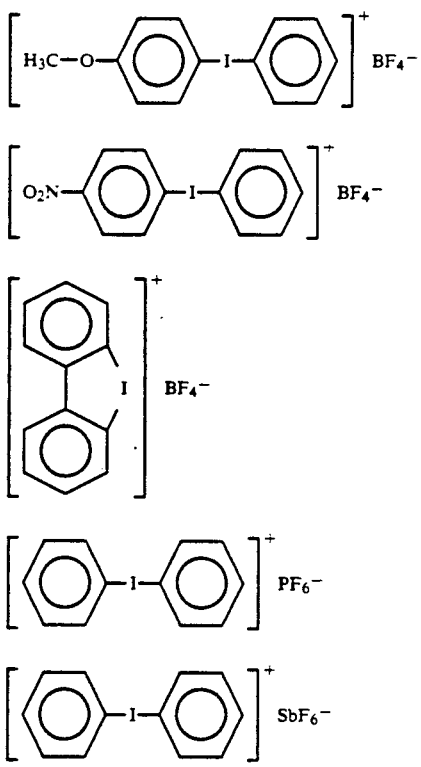

A)

B)

C)

D)

E)

In addition to the above polymerization initiator (D) generating a Lewis acid, it is possible to use a proper known hardner selected from polyamines, polyamides, acid anhydrides, boron trifluorideamine complexes, imidazoles, complexes of imidazoles with metal salts, in case where necessary.

The active energy-ray-curing resin composition to be used for manufacturing a liquid jet recording head according to this invention is one that is cured with irradiation of an active energy ray. In the case where there are used a graft copolymerized polymer (A) and/or a linear polymer (B) respectively having photopolymerizability and an active energy ray with a wavelength of 250 nm to 450 nm, it is desired to place a radical polymerization initiator having the properties of being activated with the action of an active energy ray, forming organic free radicals and initiating radical polymerization in the said resin composition.

Specific examples of such radical polymerization initiators include benzyl ether: benzoin alkyl ethers such as benzoin isobutyl ether, benzoin isopropyl ether, benzoin-n-butyl ether, benzoin ethyl ether, benzoin methyl ether and the like; benzophenones such as benzophenone, 4,4'-bis (N,N-diethylamino)benzophenone benzophenone methyl ether and the like; anthraquinones such as 2-ethylanthraquinone, 2-tert-butylanthraquinone and the like; xanthones such as 2,4-dimethylthioxanthone, 2,4-diisopropylthioxathone and the like; acetophenones such as 2,2-dimethoxy-2-phenylacetophenone, $\alpha$, $\alpha$-dichloro-4-phenoxyacetophenone, p-tert-butyltrichloroacetophenone, p-tert-butyldichloroacetophenone, 2,2-diethoxyacetophenone, p-dimethylaminoacetophenone and the like: or hydroxycyclohexylphenyl ketone (e.g., Irugacure 184, produced by Ciba Geigy Co.), 1-(4-isopropylphenyl)-2-hydroxy-2-methylpropane-1-on (e.g. Darocure 1116, produced by Merck Co.): 2-hydroxy-2-methyl-1-phenylpropane-1-on (e.g. Darocure 1173, produced by Merck Co.): etc., as preferable ones.

In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

Next, the formulation ratio of the respective components as described above may be suitably selected depending on the use site or the use purpose of the active energy-ray-curing resin composition containing these components in the liquid jet recording head of the present invention.

For example, in a preferred embodiment, the weight ratio of the graft copolymerized polymer A to the linear polymer (B) is desired to be such that (A):(B) is in the range of from 80:20 to 50:50 in parts by weight.

This situation is an important factor for the active energy-ray-curing resin composition according to this invention to exhibit a desired adhesiveness to a substrate based on the graft copolymerized polymer (A) and a desired patterning property based on the linear polymer (B).

In addition to the above, the weight ratio of the sum amount of the graft copolymerized polymer (A) and the linear polymer (B) to the half-esterificated epoxy resin (C) is desired to be such that [(A)+(B)]:(C) is in the range of from 100:50 to 100:200 in parts by weight.

Further, the weight ratio of the sum amount of the graft copolymerized polymer (A), the linear polymer (B) and the half-esterificated epoxy resin (C) to the polymerization initiator (D) is desired to be such that [(A)+(B)+(C)]:(D) is in the range of from 100:1 to 100:10 in parts by weight.

In the case where the foregoing radical polymerization initiator (E) or/and the foregoing photopolymerization accelerator (F) is used in addition to the polymerization initiator, the weight ratio of the sum amount of the above (A), (B) and (C) to the above (E) or (F) or the sum amount of them is desired to be such that [(A)+(B)+(C)]:(E) or (F) or [(E)+(F)] is in the range of from 100:1 to 100:10 in parts by weight.

The active energy-ray-curing resin composition to be used in this invention may further contain additives such as catalysts for condensation crosslinking, heat polymerization inhibitors, colorants such as dyes and pigments, fillers, heat stabilizers such as hydroquinone or paramethoxyphenol, adhesion promotors, plasticizers, extender pigments such as silica or talc, leveling agents of imparting coating suitability, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant, there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used.

For the manufacture of the liquid jet recording head according to the present invention, as the solvent to be used when employing the active energy-ray-curing resin composition in the form of a liquid or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvent as the main component, mixed optionally appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after patterning.

Upon manufacturing the liquid jet recording head of the present invention, the resin composition can form a cured layer on a substrate etc., in the usual way. Specific examples of such method will be below illustrated:

(1) In the case of forming a cured film coat on a substrate, the active energy-ray-curing resin composition is liquid state is applied onto the substrate to form a liquid coat thereon which is followed by evaporation to dryness, then the resultant dried coat is cured by irradiating it with an active energy ray.

(2) In the case of forming a protective cured layer in the form of a desired pattern on a substrate, the active energy ray-curing resin composition in liquid state is applied onto the substrate to form a liquid coat thereon which is followed by evaporation to dryness, the resultant dry layer is scanned with laser beam in a desired pattern, and the unexposed portion is etched off with a proper solvent such as 1,1,1-trichloroethane to thereby form a protective cured layer in the form of a desired pattern on the substrate.

(3) In the case of forming a protective cured layer coat in the form of a desired pattern on a substrate, the active energy-ray-curing resin composition in liquid state is applied onto the substrate to form a liquid coat thereon which is followed by evaporation to dryness, a photomask having a pattern with a desired shape which does not transmit any active energy ray is superposed on the resultant dry film layer, then exposure with an active energy ray is effected from above the photomask, and the unexposed portion is removed by a proper solvent such as 1,1,1-trichloroethane to thereby form a protective cured layer in the form of a desired pattern on the substrate.

(4) In the case of forming a photosensitive dry film and laminating said dry film on a substrate, the active energy-ray-curing resin composition in liquid state is applied onto a polyethylene terephthalate film to form a liquid coat thereon which is followed by evaporation dryness, whereby obtaining a photosensitive dry film on the said polyethylene terephthalate film, the resultant is laminate onto a substrate in accordance with the conventional lamination method to obtain a laminate, and the photosensitive dry film as laminated on the substrate is cured by irradiating it with an active energy ray in the same way as in the above method (1).

If the resulting cured photosensitive film is desired to have been shaped in a desired pattern, the above dry film as laminated on the substrate is treated in the same way as the above method (2) or (3).

In the case where the active energy-ray-curing resin composition is one that contains the monomer represented by the foregoing formula (X), the cured film as obtained in any of the above methods (1) to (4) is desired to be further subjected to heat-treatment at a temperature of 80° C. to 200° C. to thereby condensingly cure it.

The active energy ray to be used for curing the active energy ray-curing resin composition of this invention or for the pattern exposure may include ultraviolet rays (UV-rays) or electron beams which have widely been practicably applied. As the UV-ray light source, there may be employed high pressure mercury lamps, ultra-high pressure mercury lamps, metal halide lamps, etc., enriched in light with wavelength of 250 nm to 450 nm preferably those which can give a light intensity of about 1 mW/cm$^2$ to 100 mW/cm$^2$ at the wavelength in the vicinity of 365 nm at a distance between the lamp and the material to be irradiated which is practicably permissible. The electron beam irradiation device is not particularly limited, but a device having a dose within the range of 0.5 to 20 M Rad is practicably suitable.

Referring now to the case of forming the liquid path wall 3H with a cured film of the dry film type obtained from the above-mentioned resin composition as an example, the method for preparing the liquid jet recording head is to be described.

FIG. 2 to FIG. 6B are schematic diagrams for illustration of the preparation procedure of the liquid jet recording head of the present invention.

Figure 2:
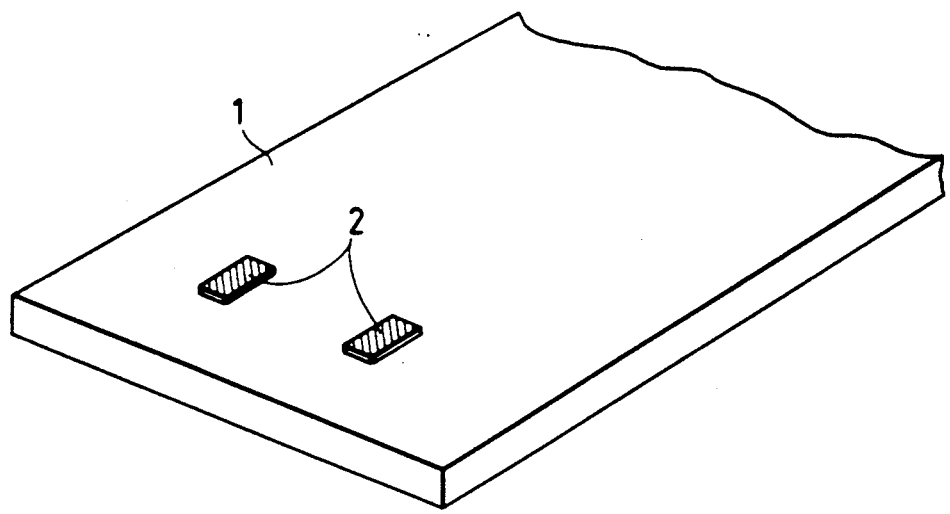

For formation of the liquid jet recording head of the present invention, as shown in FIG. 2, discharge energy generating devices 2 such as heat generating element, piezoelectric elements, etc. are arranged in a desired number on the substrate I of glass, ceramic, plastic or metal, etc. If necessary, for imparting resistance to the liquid for recording, electrical insulation, etc. to the surface of the substrate, said surface may be coated with a protective layer of $SiO_2$, $Ta_2O_5$, glass, etc. To the discharge energy generating elements 2 are connected electrodes for inputting recording signals, although not shown.

Figure 3A:
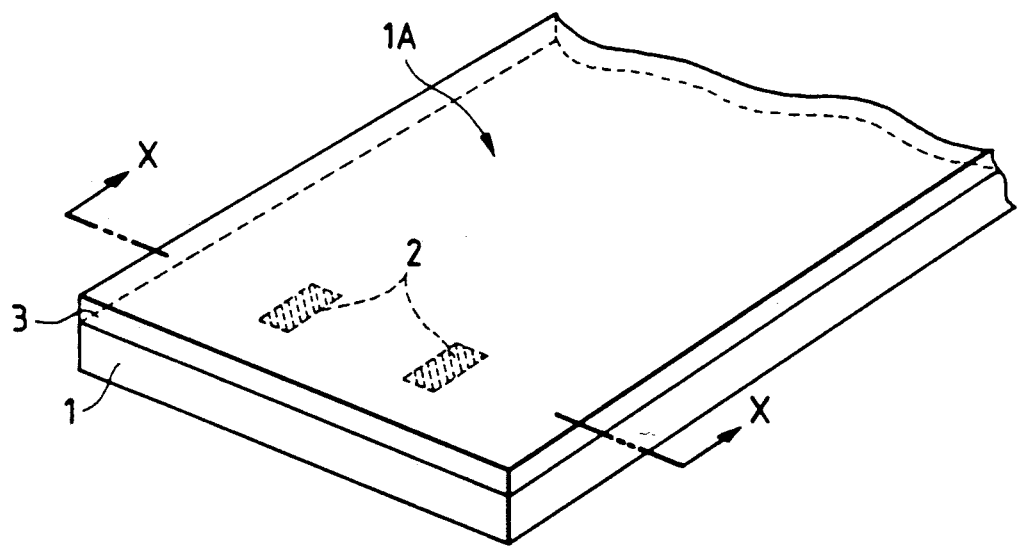
Figure 3B:
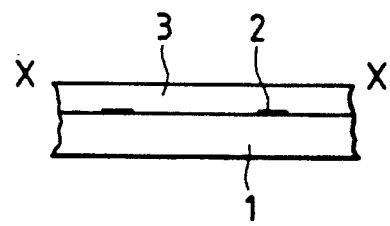

Next, after cleaning and drying at, for example, 80° to 150° C. of the surface of the substrate 1 obtained via the step shown in FIG. 2, as shown in FIG. 3A and FIG. 3B, the above-described active energy-ray-curing resin composition 3 of the dry film type (film thickness: about 20 μm to b 200μm) is heated to about 40° to 130° C., and laminated on the substrate surface 1A under the conditions of, for example, a speed of 0.5 to 0.4 f/min. and pressurization of 1 to 3 Kg/cm$^2$.

Figure 4:
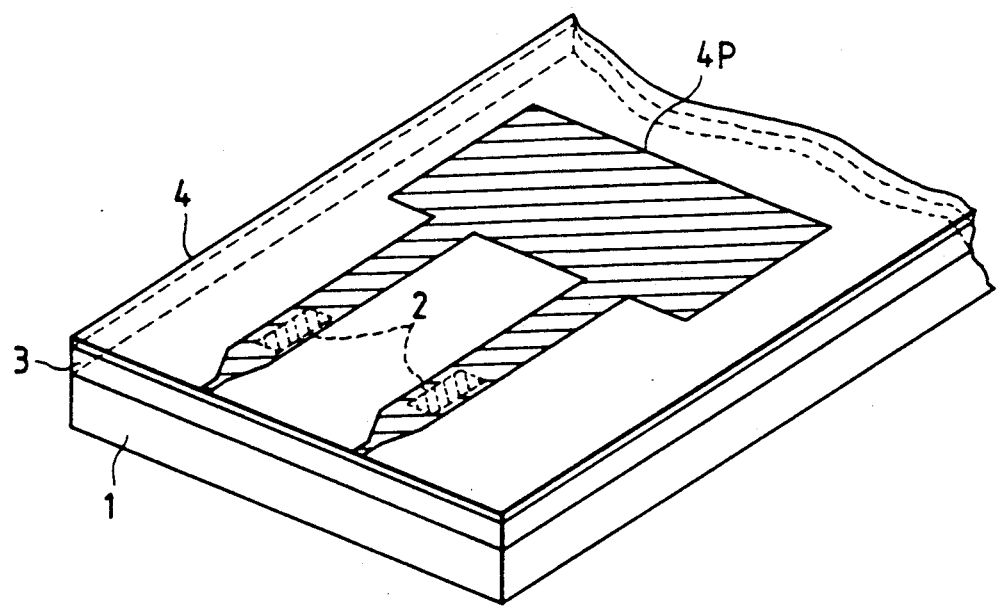

Subsequently, as shown in FIG. 4, after a photomask 4 having a pattern 4P with a predetermined shape which does not transmit the active energy ray is superposed on the dry film layer 3 provided on the substrate surface 1A, exposure is effected from above the photomask 4.

Alignment between the photomask 4 and the substrate I is effected so that the above elements 2 may be positioned in the liquid path regions formed finally via the steps of exposure, developing processing, etc., and can be practiced according &o the method in which alignment marks are drawn respectively on the substrate 1 and the mask 4, and alignment is effected following the marks.

By carrying out thus exposure, the portions other than the region covered with the above-mentioned pattern, namely the portion of the dry film layer 3 exposed is cured by polymerization to become solvent insoluble, while the portion not exposed remains solvent soluble.

Figure 5A:
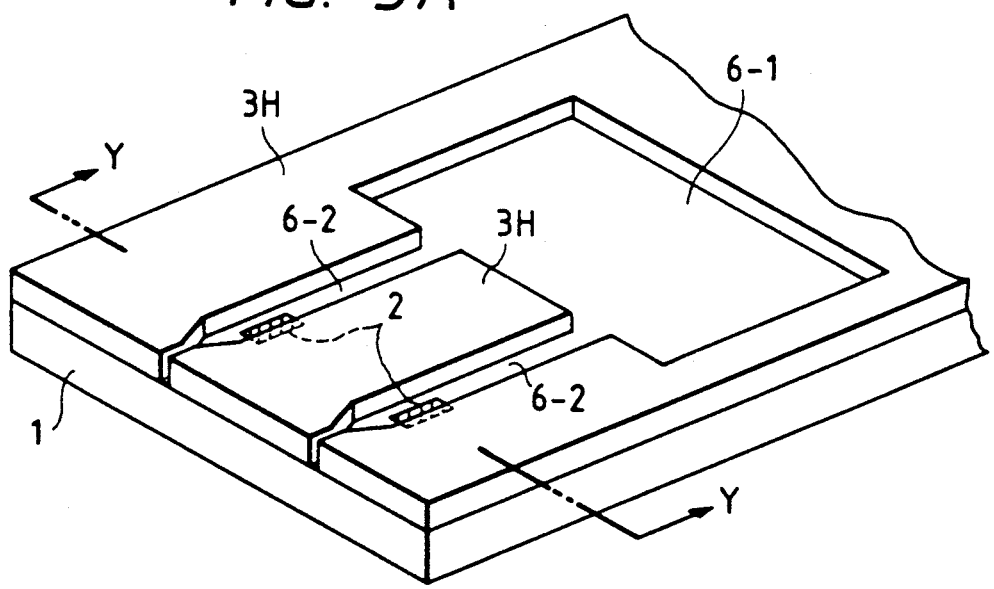
Figure 5B:
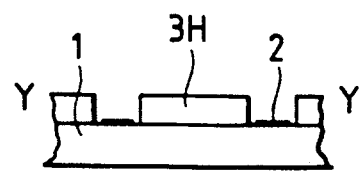

On completion of the pattern exposure of the dry film layer 3, next the exposed dry film 3 is subjected to developing processing by dipping into a volatile organic solvent such as 1,1,1-trichloroethane, etc., thereby dissolving away the unpolymerized (uncured) portion of the dry film layer 3 on the substrate which is solvent soluble to form the groove which becomes finally the liquid paths 6-2 and the liquid chamber 6-i with the resin cured film 3H remaining on the substrate 1, as shown in FIGS. 5A and 5B.

Next, the cured resin film 3H on the substrate 1 is heated at a temperature of at least 80° C. for about 10 minutes to 3 hours to carry out thermal polymerization. When a thermosetting graft copolymerized polymer is used in the resin composition 3, the heating treatment is made a temperature of at least 100° C. for about 5 to 60 minutes.

In the recording head of this example, description is made about an example by use of a resin composition of the dry film type, namely in solid state, for formation of the groove which becomes the liquid path 6-2 and the liquid chamber 6-1, but the active energy-ray-curing resin composition which can be used in formation of the recording head of the present invention is not only limited solid state, but of course liquid ones can be used.

As the method for forming a layer comprising a liquid resin composition by use of the composition on the substrate, for example, there may be employed the method by means of squeezy used during preparation of a relief image, namely in which a wall of a height corresponding &o the thickness of a coating of a desired composition is provided around the substrate, and superfluous resin composition is removed by a squeezy. In this case, the viscosity of the resin composition may be appropriately 100 cp to 3000 cp. The height of the wall placed around the substrate is required to be determined by taking into account the reduction of the solvents contained in the photosensitive resin composition by evaporation.

When a solid resin composition is used, the method of plastering a dry film onto a substrate by heating pressure contact as described above is suitable.

However, in forming the recording head of the present invention, the solid film type is convenient in handling, or with respect to easy and accurate control of the thickness.

Figure 6A:
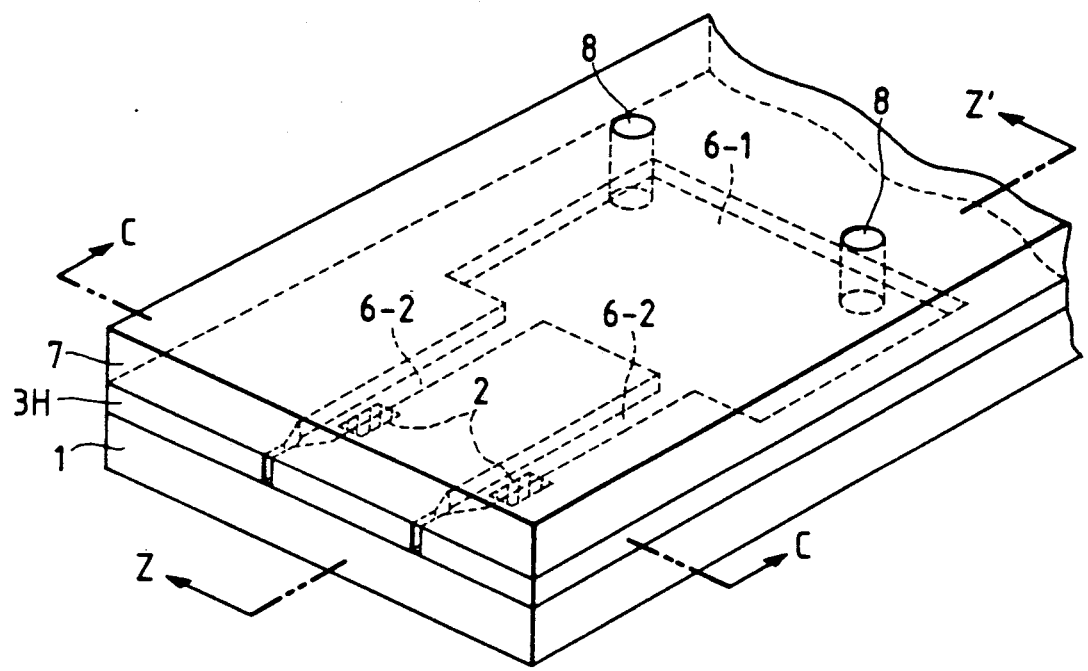
Figure 6B:
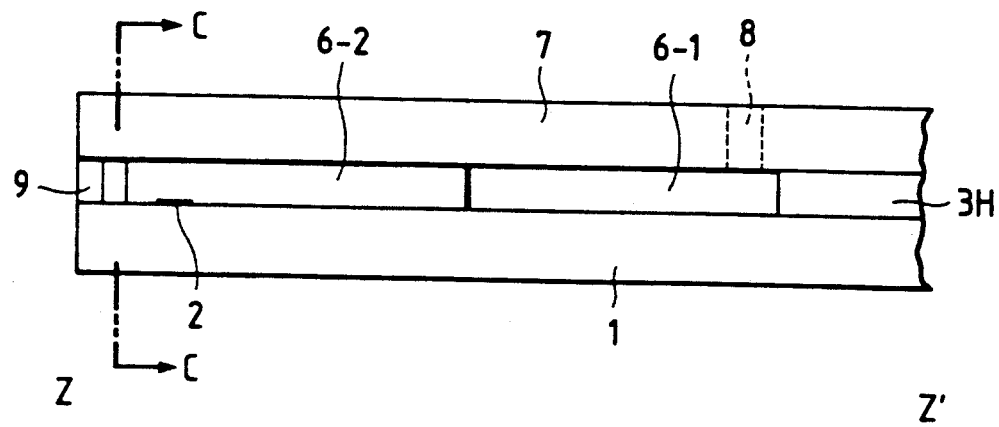

After having thus formed the groove constituting finally the liquid path 6-2 and the liquid chamber 6-1 with the resin cured film 3H, a flat plate 7 which becomes the cover of the groove is bonded to the resin cured film 3H with an adhesive to form a bonded product, as shown in FIGS. 6A and 6B.

In the step shown in FIGS. 6A and 6B, as a specific method for providing the cover 7, there is, for example, the method in which the flat plate 7 of glass, ceramic, metal, plastic, etc. is spin coated with an epoxy type adhesive to a thickness of 3 to 4 μm, then preheated to effect the so called B-staging and plastering this onto the cured dry film 3H, followed by main curing of the above-mentioned adhesive layer, etc. However, there may be also employed the method not using an adhesive in which the flat plate 7 of a thermoplastic resin such as acrylic resin, ABS resin, polyethylene, etc. is directly thermally fused onto the resin cured film 3H.

Also, it is preferable to use the method in which a resin layer comprising the resin composition for formation of a resin cured film in the present invention is provided on the side to be bonded to the liquid path of the cover 7 thermally, fused with the resin cured film 3H having the liquid paths formed, and then heated by irradiation of an active energy ray. That is, this is the method in which the resin composition for formation of a resin cured film in the present invention is used as an adhesive.

In FIGS. 6A and 6B, 6-1 shows the liquid chamber, 6-2 the liquid paths, 8 the thru-hole for connecting the feeding pipe (not shown) for feeding the liquid for recording into the liquid chamber from the outside of the recording head to the inside.

Thus, after completion of bonding of the resin cured film 3H provided on the substrate 1 with the flat plate 7, the bonded product is cut along C—C corresponding to the downstream side of the liquid path 6-2 shown in FIGS. 6A and 6B to form orifices for discharging the liquid for recording which are openings of the liquid paths at the cut surface.

This step is done for optimizing the interval between the discharge energy generating device 2 and the orifice 9, and here the region to be cut may be suitably selected. In carrying out this cutting, the dicing method, etc conventionally employed in semiconductor industries can be employed.

The downstream portion of the liquid path as mentioned in the present invention refers to the downstream region in the flow direction of the liquid for recording when recording is performed by use of a recording head, specifically the portion of the liquid path downstream of the position where the discharge energy generating device 2 is provided.

When cutting is completed, the cut surface is polished to be smoothened, and the feeding pipes (not shown) are mounted on the thru-hole 8 to complete the liquid jet recording head as shown in FIGS. 1A and 1B.

In the example as described above, after formation of the resin cured film 3H on the substrate 1, the cover 7 is bonded thereto, but it is also possible to form the resin cured film 3H on the side of the cover 7 and then bond it to the substrate 1. Also, the liquid paths 6-2 and the liquid chamber 6-1 may be separately formed.

A preferred example of a recording apparatus employing the recording head in accordance with the present invention is described by referring to the drawing.

Figure 11:
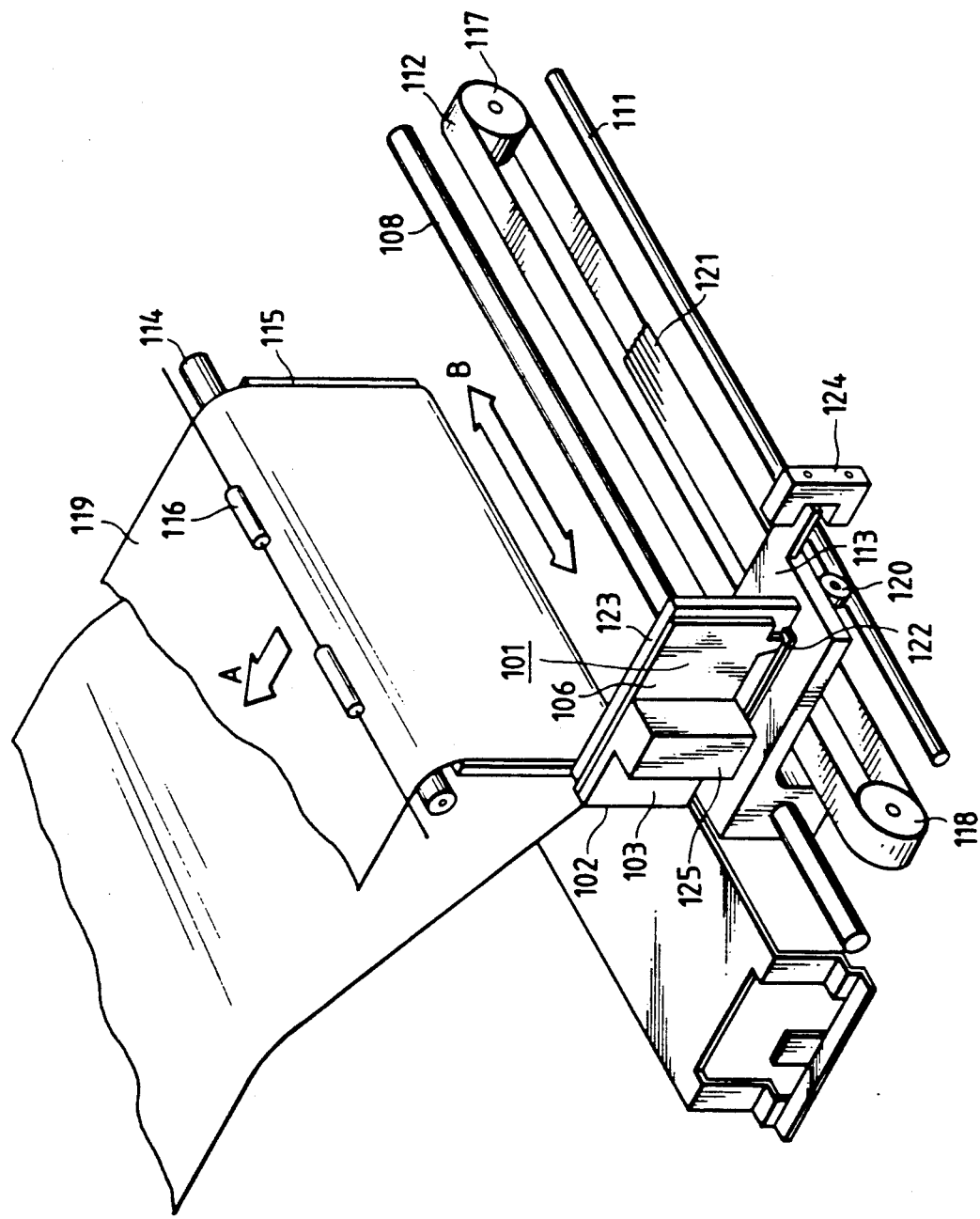
FIG. 11 is a schematic perspective view showing an example of the recording apparatus of the present invention.

FIG. 11 is a perspective view schematically showing an embodiment of the liquid ejection recording apparatus of the present invention. In FIG. 11, reference numeral 119 designates recording paper. The recording paper 119 is moved on a platen 115 at a predetermined speed in the subsidiary scanning direction (the direction of arrow A) by a paper feeding roller 114 and a pinch roller 116. Reference numeral 117 and 118 denote pulleys supported on respective shafts and rotated by a drive source (not shown). A carriage driving belt 112 is passed over the pulleys 117 and 118.

A carriage 113 is integrally fixed to the carriage driving belt 112. The carriage 113 is guided by guide shafts 108 and 111 and is reciprocally movable in the major scanning directions (the directions of arrow B) by the rotation of the pulleys 117 and 118 a roller 120 adapted to roll on the guide shaft 111 is disposed on the underside of the carriage 113.

A connector 122 electrically connected to flexible wiring 121 is disposed substantially in the central portion of the carriage 113, and a head aligner 123 or aligning the liquid ejection recording head (hereinafter referred to as the recording head) 101 when the wires of the recording head 101 are connected and fixed to the connector 122 is vertically provided on the carriage 113. Accordingly, the recording head 101 is removable from the carriage 113 by the connector 122. Also, a sensor 124 for detecting the home position of the carriage 113 is provided.

The recording head 101 has a substrate 106, which in turn has thereon discharge ports 102 for discharging ink droplets which are flying droplets, a liquid flow path constituting portion 103 for constituting liquid flow paths communicating with the discharge ports 102 and having energy generating members such as heat generating elements for forming flying ink droplets, and an ink chamber for storing therein ink to be supplied to the liquid flow paths. To the energy generating members of the recording head 101, a driving voltage is supplied from a driving voltage generating circuit 129 (not shown) through the connector 122 and the flexible wiring 121 and also, a discharge control signal for controlling the discharge of ink droplets from the discharge ports 102.

The present invention is described in more detail by referring to Synthesis Examples and Examples. However, the present invention is not limited to the following Examples at all.

SYNTHESIS EXAMPLE 1

The following materials were provided as the components of the active energy-ray-curing resin composition used for the recording head according to the present invention.

PREPARATION OF A GRAFT COPOLYMERIZED POLYMER (A)

Radical chain transfer polymerization of 80 parts by weight of 2-hydroxyethylmethacrylate and 20 parts by weight of butylacrylate was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 30 parts by weight of the said macromonomer and 70 parts by weight of methylmethacrylate was carried out in methyl cellosolve solvent to thereby obtain a graft copolymerized polymer having a weight average molecular weight of about 50,000 and a number average molecular weight of about 12,000.

A LINEAR POLYMER (B)

There was provided a linear acrylic polymer obtained by polymerizing methylmethacrylate, isobornylmethacrylate and 2-hydroxyethylacrylate in the molar ratio of 70:20:10. This linear acrylic polymer was one that has a number average molecular weight of about 70,000 and a weight average molecular weight of about 250,000.

A HALF-ESTERIFICATED EPOXY RESIN (C)

There was provided a 50% acrylic ester of o-cresol novolac type epoxy resin (condensation degree: 6-7)

A POLYMERIZATION INITIATOR (D)

There were provided the following two polymerization initiators (D)-(1) and (D)-(2):

(D)-(1): the foregoing photosensitive aromatic onium salt (l) (trade name: UVE-1014, produced by General Electric Co., Ltd.)

(D)-(2): IRGACURE 651 (trade name, produced by Ciba Geigy Co.)

The above components (A) to (D)-(2) were well mixed by the weight ratios as below shown in accordance with the conventional mixing technique to thereby obtain the active energy-ray-curing resin composition, in which there were used the additives as below shown.

| Component | Parts by weight |
|---|---|
| (A) | 80 |
| (B) | 20 |
| (C) | 100 |
| (D)-(1) | 6 |
| (D)-(2) | 6 |
| Methylene Blue | 1 |
| methyl cellosolve | 200 |
| methylethyl ketone | 100 |

SYNTHESIS EXAMPLE 2

The following components were prepared for ones of an active energy-ray-curing resin composition to be utilized for the formation of a recording head according to the present invention.

PREPARATION OF A GRAFT COPOLYMERIZED POLYMER (A)

The method according to that described in Synthesis example 1 was repeated except that 50 parts by weight of 2-hydroxyethylmethacrylate and 50 parts by weight of butoxymethylacrylamide were used instead of 80 parts by weight of 2-hydroxyethylmethacrylate and 20 parts by weight of butylacrylate to obtain a macromonomer having a methacryloyl group at one terminal end of the molecular chain. The result of the meaurement by the known GPC method gave a value of about 2,000 for the number average molecular weight of the resulting macromonomer.

Solution polymerization of 30 parts by weight of the said macromonomer and 70 parts by weight of methylmethacrylate was carried out in the mixture of methylcellosolve: methyl ethyl ketone (MEK)=60:40 (by weight) to thereby obtain a heat curable graft copolymerized polymer having a number average molecular weight of about 6,000 and a weight average molecular weight of about 45,000.

A LINEAR POLYMER (B)

There was provided a linear acrylic copolymer obtained by polymerizing methylmethacrylate, tricyclodecane-methacrylate and N-methylolacrylamide in the molar ratio of 60:30:10. This linear acrylic copolymer was one that has a number average molecular weight of about 60,000 and a weight average molecular weight of about 260,000.

A HALF-ESTERIFICATED EPOXY RESIN (C)

There was provided a 50% acrylic ester of phenol-novolac type epoxy resin (condensation degree: 5~6).

A POLYMERIZATION INITIATOR (D)

There were provided the following two polymerization initiators (D)-(1) and (D)-(2):

(D)-(1): the foregoing photosensitive aromatic onium salt (m)

(D)-(2): Darocure 1173 (produced by Merck Co.)

The above components (A) to (D)-(2) were well mixed by the weight ratio as below shown in accordance with the conventional mixing technique to obtain, the active energy-ray-curing resin composition, in which there were used the additives as shown below.

| Component | Parts by weight |
| --- | --- |
| (A) | 50 |
| (B) | 50 |
| (C) | 100 |
| (D)-(1) | 6 |
| (D)-(2) | 6 |
| Methylene Blue | 1 |
| methyl cellosolve | 200 |
| methyl ethyl ketone | 100 |

Next, various resin composition solutions obtained in Synthesis examples 1 and 2 as described above were each coated by a reverse coater on a polyethylene terephthalate film of 25 μm (Lumilar T type) to a film thickness of 50 μm after drying. For the cover film, a stretched polyethylene film of 40 μm was employed. As described above, a dry film with a constitution having an active energy-ray-curing composition layer sandwiched between two films was obtained.

EXAMPLE 1

By use of the dry film prepared in Synthesis example 2, following the steps in FIG. 1 to FIG. 6 as described previously in the specification, preparation of an on-demand type liquid jet recording head of the type shown in FIG. 7H having 10 heat generating devices [Hafnium boride ($HfB_2$)] and orifices provided corresponding to said heat generating devices (orifice dimensions: 70 μm × 50 μm, arrangement pitch 0.12 mm) was practiced as described below. The recording heads of the same shape were trially made each in number of 30.

First, a plurality of heat generating devices were arranged at predetermined positions on a substrate comprising silicon, and electrodes for application of recording signals were connected to these.

Next, a $SiO_2$ layer (thickness 1.0 μm) as the protective layer was provided on the substrate surface having heat-generating devices arranged thereon, and after the surface of the protective layer was cleaned and dried, the dry film with a thickness of 50 μm prepared in Synthesis example 2 heated to 120° C. was laminated by use of a rubber roll under the conditions of a roll temperature of 95° C. and a circumferential speed of 1 m/min, while peeling off the polyethylene film.

Next, with a photomask having a pattern corresponding to the liquid path and the liquid chamber superposed on the dry film provided on the substrate surface, registration was performed so that the above devices could be provided in the liquid path to be finally formed followed by vacuum adhesion, and then exposure was effected from above the photomask on the dry film by use of a ultra-high pressure mercury lamp with a UV-ray intensity around 365 nm of 7 mW/cm² and a high parallel degree with a collimation argument of 3° for 35 seconds.

Next, after exposure, the dried coating film was subjected to spray developing processing with Eterner Nu at 20° C. for 50 seconds, thereby dissolving away the unpolymerized (uncured) portion of the dry film to form a groove which becomes finally the liquid path and the liquid chamber with the wall comprising the cured dry film remaining on the substrate.

After completion of developing process, post-exposure (UV post-cure) was effected on the cured dry film on the substrate with a ultra-high pressure mercury lamp under the same conditions as previously used for pattern exposure for 5 minutes, and a further heating treatment was performed to apply post-curing treatment at 150° C. for 15 minutes.

On the other hand, on the flat plate having a liquid chamber formed thereon and provided with a thru-hole comprising soda glass was laminated the dry film prepared in Synthesis example 2 by use of a rubber roll under the conditions of a roll temperature of 95° C. and a circumferential speed of 1 m/min, while peeling off the polyethylene film. Subsequently, exposure and developing were performed under the same conditions as during formation of the liquid path and the liquid chamber as described above except for using a mechanical mask to remove the dry film on the above-mentioned liquid chamber.

The cured dry film surface on the above substrate was bonded under pressurization to the cured dry film on the above-mentioned flat plate, followed further by irradiation of a UV-ray (50 mW/cm², 60 seconds) from the flat plate side, thereby effecting fixing by adhesion to form a bonded product.

Subsequently, the place downstream side of the liquid path of the bonded product, namely 0.150 mm downstream side from the position where the discharge energy generating device was located, was cut vertically to the liquid path by means of a commercially available dicing saw (trade name: DAD 2H/6 Model, Disco) to form an orifice for projecting the liquid for recording.

Finally, the cut surface was washed and then dried, followed further by polishing of the cut surface to effect smoothening and mounting of the feeding pipe of the liquid for recording on the thru-hole to complete the liquid jet recording head. The recording heads obtained were all found to be excellent in dimensional precision having liquid paths and liquid chamber reproducing faithfully the mask pattern. In this connection, the orifice dimensions were within the ranges of longitudinally 50±5 μm, laterally 70±5 μm, and the orifice pitch within the range of 120±5 μm.

The quality and the durability during prolonged use of the recording heads thus prepared were tested as described below.

First, for the recording heads obtained, the durability test of performing the dipping treatment in the liquids for recording comprising the following compositions at 60° C. for 1000 hours (the environmental conditions comparable with those during the actual prolonged use of recording heads) was practiced.

LIQUID COMPONENTS FOR RECORDING

1) $H_2O$/diethylene glycol/1,3-dimethyl-2-imidazolidinone/C.I. Direct Blue 86[1] (=57/30/10/3 parts by weight) pH=8.0
2) $H_2O$/diethylene glycol/N/methyl-2-pyrolidone/C.I. Direct Black 154[2] (=55/30/10/5 parts by weight) pH=9.0
3) $H_2$)/diethylene glycol/polyethylene glycol #400/N-methyl-2-pyrrolidone/C.I. Direct Yellow 86[3] (=65/10/10/10/5 parts by weight) pH=7.0
4) $H_2O$/ethylene glycol/triethylene glycol/triethylene glycol monomethyl ether/C.I. Food Black 2[4] (=67/10/15/5/3 parts by weight) pH=10.0.

The notes [1] to [4] are water-soluble dyes, and sodium hydroxide was employed for pH control.

After the durability test, for each of the heads practiced with the test, the bonding state of the cured dry film to the substrate and the cover was observed. As the result, no peel-off and damage was recognized at all in all the recording heads, thus exhibiting good close contact.

On the other hand, measurements of the viscosity and the surface tension of the ink used in the dipping treatment, measurement of the absorbance of the ink, and observation of generation of agglomerated product in the ink were respectively conducted. The surface tension was not substantially lowered, no change in absorbance recognized, and no generation of agglomerated product recognized with naked eyes. Accordingly, the ink used in the dipping treatment was filled in other heads for examination whether there is practical influence on discharge characteristics. As the result, in all the beads, normal printing was possible. From the above results, it can be understood that the recording head of the present invention comprises the structural member with little influence on the ink jet ink.

Next, separately, for 10 recording heads obtained, each head was mounted on the recording apparatus shown in FIG. 11, and the printing test was practiced, which performed printing by use of the liquid for recording as mentioned above by applying a recording signal of $10^8$ pulses on the recording head continuously for 14 hours. Concerning either recording head, immediately after initiation of printing and after elapse of 14 hours, substantially no lowering in performance was recognized in both discharging performance and print state of the liquid for recording, thus evidencing a recording head excellent in durability.

Also, the heads were disassembled after completion of the printing, and the dimensions of the discharge opening and the peripheral portion of the discharge energy generating element were measured. As the result, the change in dimension was 2 $\mu$ or less, substantially without change caused by the heat and pressure accompanied with bubbling, which have been the problems in the photosensitive resin of the prior art such as swelling, sinking, etc., thus exhibiting good state.

EXAMPLE 2

A recording head was prepared in the same way as that in Example 1 except that the composition according to Synthesis Example 1 was used instead of the dry film according to Synthesis Example 2 used in Example 1.

The recording head thus prepared has good precision and affords good results in the durability test and printing test similarly to that in Example 1.

As described above, the active energy-ray-curing resin composition used in the constitution of the liquid jet recording head of the present invention comprises the graft copolymerized component (A) as the constituent and therefore has sufficient adhesion to various members without addition of an additive, and also contains the linear polymer (B) as the constituent and is therefore excellent in developing characteristics during pattern formation. Also, its cured film has sufficient chemical resistance and durability.

Further, the composition employs the graft copolymerized polymer and the linear polymer as the polymeric substances which are its constituents in combination, and therefore a coating with solvent resistance to the developer is obtained with less active energy irradiation as compared with the case when employing only the graft copolymerized polymer alone as the polymeric substance. As the result, the properties of the patterning process are improved, such that resolution can be improved and pattern formation can be effected without being influenced by the kinds or the states of the members, etc., whereby the working conditions width can be expanded.

Since said composition uses a half-esterified epox resin as the active energy-ray-curing components, firstly the reaction itself is faster and the utilizable wavelength is longer as compared with that used in the active energy-ray-curing system of an epoxy resin, whereby sensitivity is higher. The second specific feature is that since an epoxy resin component is contained in the molecule, a very dense crosslinked product is obtained by performing post-cure (treatment for curing of epoxy group) during the recording head preparation steps, whereby there is no chemical denaturation received from the ink for ink jet, and at the same time the components dissolved out into the ink has become very little. From the above-mentioned two facts, the recording head is by far superior in durability both mechanically and chemically.

Since said composition uses a half-esterified epoxy resin as the active energy-ray-curing components, firstly the reaction itself is faster and the utilizable wavelength is longer as compared with that used in the active energy-ray-curing system of an epoxy resin, whereby sensitivity is higher. The second specific feature is that since an epoxy resin component is contained in the molecule, a very dense crosslinked product is obtained by performing post-cure (treatment for curing of epoxy group) during the recording head preparation received from the ink for ink jet, and at the same time the component dissolved out into the ink has become very little. From the above-mentioned two facts, the recording head is by far superior in durability both mechanically and chemically.

Therefore, the recording head of the present invention which employs the cured product of the composition as at least a part of its constitution is inexpensive and precise, and becomes higher in reliability. Also, by formation of the liquid path wall with the cured film of the composition, a recording head having the liquid path finely worked with good precision and good yield can be obtained.

Further, the recording head of the present invention, by having the constitution as described above, becomes higher in reliability and excellent in durability also when formed into a multi-orifice type.

We claim:

1. A liquid jet recording head comprising a cured product of an active energy-ray-curing resin composition at least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer selected from the group consisting of alkyl methacrylates, acrylonitrile and styrene and has graft chains having structural units derived from at least one monomer selected from the group consisting of the monomers represented by the following formula x and other monomers presented by the formula y:

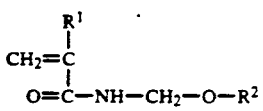  (x)

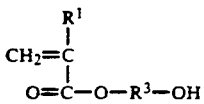  (y)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, alkylether group represented by the formula: $-CH_2)_nO-CH_2)_m$ (wherein $2 \leq m+n \leq 6$, $n \neq 0$ and $m \neq 0$), or a phenylalkyl group represented by the formula:

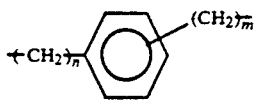

(wherein $2 \leq m+n \leq 4$, or the case where $n=0$ or $m=0$ is contained), added to said trunk chain;

(B) a linear polymer having a number average molecular weight of 50,000 or more and a weight average molecular weight of 350,000 or less and having a glass transition temperature of 60° C. or more which comprises structural units derived from at least one monomer selected from the group consisting of methyl methacrylate, ethyl methacrylate, isobutyl methacrylate, t-butyl methacrylate, benzyl acrylate, tricyclodecaneacrylate, tricyclodecane methacrylate, acrylonitrile, isobornyl methacrylate, isobornyl methacrylate, tricyclodecaneoxyethyl methacrylate, styrene. dimethylaminoethyl methacrylate and cyclohexyl methacrylate and other structural units derived from at least one monomer selected from the group consisting of the monomers represented by said formula (x) and the monomers represented by said formula (y);

(C) a resin esterificated at part of epoxy groups present in an epoxy resin containing at least one compound having two or more epoxy groups in one molecule with an unsaturated carboxylic acid; and (D) a polymerization initiator capable of generating a Lewis acid with irradiation of an active energy ray.

2. The recording head according to claim 1, wherein the weight ratio of said graft copolymerized polymer (A) to said linear polymer (B) is such that (A):(B) is in the range from 80:20 to 50:50.

3. The recording head according to claim 1 or 2, wherein the weight ratio of the sum weight of said graft copolymerized polymer (A) and said linear polymer (B) to said epoxy resin (C) is such that [(A)+(B)]:(C) is in the range from 100:50 to 100:200.

4. The recording head according to anyone of claims 1 to 3, wherein the weight ratio of the sum of said graft copolymerized polymer (A), said linear polymer (B) and said epoxy resin (C) to said polymerization initiator (D) is such that [(A)+(B)+(C)]:(D) is in the range from 100:1 to 100:10.

5. The recording head according to anyone of claims 1 to 4, wherein said polymerization initiator (D) comprises at least one compound selected from the group consisting of aromatic halonium salt compounds and aromatic onium salt compounds having photosensitivity containing an element belonging to group VIa or group Va of the periodic table.

6. The recording head according to claim 1, wherein said part is a member having formed a discharge opening for discharging ink.

7. The recording head according to claim 1, wherein said part is a member which defines a liquid path communicating with a discharge opening for discharging ink.

8. The recording head according to claim 7, wherein the member defining the liquid path is a liquid path wall.

9. The recording head according to claim 1, wherein said part is a member provided on a member which defines a liquid path communicating with a discharge opening for discharging ink.

10. The recording head according to claim 9, wherein the member provided is used as an adhesive layer.

11. The recording head according to claim 9, wherein the member provided is a flat plate.

12. The recording head according to claim 1, which comprises a discharge energy generating element.

13. The recording head according to claim 12, wherein the discharge energy generating element is a heat generating element.

14. The recording head according to claim 12, wherein the discharge energy generating element is a piezoelectric element.

15. The recording head according to claim 12, wherein a discharge opening for discharging ink is provided so as to oppose the discharge energy generating element.

16. A liquid jet recording apparatus comprising a liquid jet recording head having a discharge opening for discharging recording liquid, a driving circuit for driving said recording head and platen, said liquid jet recording head comprising a cured product of an active energy-ray-curing resin composition as at least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer selected from the group consisting of alkyl methacrylates, acrylonitrile and styrene and has graft chains having structural units derived from at least one monomer selected from the group consisting of the monomers represented by the following formula x and other monomers presented by the formula y:

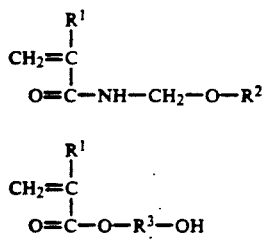

(wherein $R^1$ is hydrogen or an alkyl or hydroxyalkyl group having 1 to 3 carbon atoms. $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms an alkylether group represented by the formula: $\text{-CH}_2)_n\text{O-CH}_2)_m$ (wherein $2 \leq m+n \leq 6$, $n \neq 0$ and $m \neq 0$), or a phenylalkyl group represented by the formula:

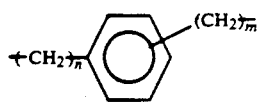

(wherein $2 \leq m+n \leq 4$, or the case where $n=0$ or $m=0$ is contained), added to said trunk chain;

(B) a linear polymer having a number average molecular weight of 50,000 or more and a weight average molecular weight of 350,000 or less and having a glass transition temperature of 60° C. or more which comprises structural units derived from at least one monomer selected from the group consisting of methyl methacrylate ethyl methacrylate isobutyl methacrylate, t-butyl methacrylate benzyl methacrylate, acrylonitrile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer selected from the group consisting of the monomers represented by said formula (x) and the monomers represented by said formula (y);

(C) a resin esterificated at part of epoxy groups present in an epoxy resin containing at least one compound having two or more epoxy groups in one molecule with an unsaturated carboxylic acid; and (D) a polymerization initiator capable of generating a Lewis acid with irradiation of an active energy ray.

17. The recording apparatus according to claim 16, wherein the weight ratio of said graft copolymerized polymer (A) to said linear polymer (B) is such that (A):(B) is in the range from 80:20 to 50:50.

18. The recording apparatus according to claim 16 or 17, wherein the weight ratio of the sum weight of said graft copolymerized polymer (A) and said linear polymer (B) to said epoxy resin (C) is such that [(A)+(B)]:(C) is in the range from 100:50 to 100:200.

19. The recording apparatus according to anyone of claims 16 to 18, wherein the weight ratio of the sum of said graftt copolymerized polymer (A), said linear polymer (B) and said epoxy resin (C) to said polymerization initiator (D) is such that [(A)+(B)+(C)]:(D) is in the range from 100:1 to 100:1.

20. The recording apparatus according to anyone of claims 16 to 19, wherein said polymerization initiator (D) comprises at least one compound selected from the group consisting of aromatic halonium salt compounds and aromatic onium salt compounds having photosensitivity containing an element belonging to group VIa or group Va of the periodic table.

21. The recording apparatus according to claim 16, wherein said part is a member having formed a discharge opening for discharging ink.

22. The recording apparatus according to claim 16, wherein said part is a member which defines a liquid path communicating with a discharge opening for discharging ink.

23. The recording apparatus according to claim 22, wherein the member defining the liquid path is a liquid path wall.

24. The recording apparatus according to claim 16, wherein said part is a member provided on a member which defines a liquid path communicating with a discharge opening for discharging ink.

25. The recording apparatus according to claim 24, wherein the member provided is used as an adhesive layer.

26. The recording apparatus according to claim 24, wherein the member provided is a flat plate.

27. The recording apparatus according to claim 16, which comprises a discharge energy generating element.

28. The recording apparatus according to claim 27, wherein the discharge energy generating element is a heat generating element.

29. The recording apparatus according to olaim 27, wherein the discharge energy generating element is a piezoelectric element.

30. The recording apparatus according to claim 27, wherein a discharge opening for discharging ink is provided so as to oppose the discharge energy generating element.

* * * * *

UNITED STATES PATENT AND TRADEMARK OFFICE
CERTIFICATE OF CORRECTION

PATENT NO. : 5,086,307

DATED : February 4, 1992

INVENTOR(S) : HIROMICHI NOGUCHI, ET AL.        Page 1 of 7

It is certified that error appears in the above-identified patent and that said Letters Patent is hereby corrected as shown below:

Title page,
IN [57] ABSTRACT

Line 12, "stylene" should read --styrene--.
Line 14, ""Monomer (b)"" should read --"monomer (b)")--.
Line 25, "called monomer" should read --called "monomer--.
Line 26, "(b' ))" should read --(b' )")--.

COLUMN 1

Line 16, "2. Background" should read
         --2. Related Background--.

COLUMN 3

Line 29, "abovementioned" should read --above-mentioned--.
Line 30, "enough" should read --sufficient--.

COLUMN 4

Line 49, "us" should read --use--.

COLUMN 5

Line 4, "stylene" should read --styrene--.
Line 9, "presented" should read --represented--.
Line 28, "-CH$_2$)$_n$O-CH$_2$)$_m$" should read -- $(CH_2)_nO(CH_2)_m$ --.
Line 48, "acrylonitile," should read --acrylonitrile,--.
Line 54, "monomer (b' ))" should read --monomer (b' )")--.

COLUMN 6

Line 13, "stylene" should read --styrene--.
Line 18, "presented" should read --represented--.
Line 38, "-CH$_2$)$_n$O-CH$_2$)$_m$" should read -- $(CH_2)_nO(CH_2)_m$ --.

UNITED STATES PATENT AND TRADEMARK OFFICE
CERTIFICATE OF CORRECTION

PATENT NO. : 5,086,307

DATED : February 4, 1992

INVENTOR(S) : HIROMICHI NOGUCHI, ET AL.

It is certified that error appears in the above-identified patent and that said Letters Patent is hereby corrected as shown below:

COLUMN 6

Line 55, "consisting" should read --consisting of--.
Line 59, "acrylonitile," should read --acrylonitrile,--.
Line 65, "monomer (b' ))" should read --monomer (b' )")--.

COLUMN 7

Line 26, "Of &he" should read --of the--.
Line 41, "preferable" should read --preferred--.
Line 51, "&he" should read --the--.

COLUMN 8

Line 20, "&he" should read --the--.
Line 43, "7F]" should read --7F];--.

COLUMN 9

Line 11, "abovementioned" should read --above-mentioned--.
Line 12, "ponent ⓐ" should read --ponent (a)--.
Line 14, "abovementioned" should read --above-mentioned--.
Line 21, "N-vinylpyrolidone" should read --N-vinylpyrrolidone--.
Line 39, "monomers ⓐ and ⓑ" should read --monomers (a) and (b)--.
Line 51, "polyer (B)" should read --polymer (B)--.
Line 53, "monomer ⓒ" should read --monomer (c)--.
Line 55, "ⓑ" should read --(b)--.
Line 60, "monomer ⓑ" should read --monomer (b)--.
Line 62, "monomer ⓑ" should read --monomer (b)--.

UNITED STATES PATENT AND TRADEMARK OFFICE
CERTIFICATE OF CORRECTION

PATENT NO. : 5,086,307

DATED : February 4, 1992

INVENTOR(S) : HIROMICHI NOGUCHI, ET AL.

It is certified that error appears in the above-identified patent and that said Letters Patent is hereby corrected as shown below:

COLUMN 10

Line 2, "monomer ⓑ " should read --monomer (b)--.
Line 9, "mers ⓒ ," should read --mers (c),-- and "isobonylmethacrylate," should read --isobornylmethacrylate,--.
Line 10, "isobonylacrylate," should read --isobornylacrylate,--.
Line 17, ".half-esterificated" should read --"half-esterificated--.

COLUMN 11

Line 21, "Co.),etc." should read --Co.), etc.--.
Line 27, "Etc." should read --etc.--.

COLUMN 12

Line 28, "toluene xylene" should read --toluene, xylene,--.
Line 29, "ketone methyl" should read --ketone, methyl--.
Line 35, "becomes to lay" should read --is--.

COLUMN 13

Line 3, "of" should read --to--.
Line 8, "groups VIa" should read --group VIa--.

COLUMN 14

Line 17, "$[(R^6)_g(R^7)_hX]_i + [MQ_j]^{(k-1)}$ (III)" should read --$[(R^6)_g(R^7)_hX]_i + [MQ_j]^{-(k-1)}$ (III)--.
Line 27, "up to" should read --no more than--.

UNITED STATES PATENT AND TRADEMARK OFFICE
CERTIFICATE OF CORRECTION

PATENT NO. : 5,086,307
DATED : February 4, 1992
INVENTOR(S) : HIROMICHI NOGUCHI, ET AL.

It is certified that error appears in the above-identified patent and that said Letters Patent is hereby corrected as shown below:

COLUMN 20

Line 18, "polymer A" should read --polymer (A)--.

COLUMN 21

Line 11, "solvent" should read --solvents--.
   Line 27, "is liquid" should read --in liquid--.
   Line 62, "whereby" should read --thereby--.
   Line 64, "film, the" should read --film. The-- and "laminate" should read --laminated--.

COLUMN 22

Line 10, "formula (X)," should read --formula (x),--.
   Line 54, "b" should be deleted.
   Line 68, "&o" should read --to--.

COLUMN 23

Line 15, "substrate" should read --substrate 1--.
   Line 17, "chamber 6-i" should read --chamber 6-1--.
   Line 38, "squeezy" should read --squeegee--.
   Line 40, "&o" should read --to--.
   Line 42, "squeezy." should read --squeegee.--.

COLUMN 24

Line 10, "cover 7 thermally, fused" should read --cover 7, thermally fused--.
   Line 62, "numeral 117 and 118" should read --numerals 117 and 118--.

UNITED STATES PATENT AND TRADEMARK OFFICE
CERTIFICATE OF CORRECTION

PATENT NO. : 5,086,307
DATED : February 4, 1992
INVENTOR(S) : HIROMICHI NOGUCHI, ET AL.

It is certified that error appears in the above-identified patent and that said Letters Patent is hereby corrected as shown below:

COLUMN 25

Line 7, "or" should read --for--.

COLUMN 28

Line 3, "a" (first occurrence) should read --an--.
Line 16, "a" should read --an--.

COLUMN 30

Line 24, "epox" should read --epoxy--.
Lines 40 to 55 should be deleted.

COLUMN 31

Line 3, "at" should read --as at--.
Line 15, "presented" should read --represented--.
Line 35, "alkylether" should read --an alkylether--.
Line 36, "-CH$_2$)$_n$O-CH$_2$)$_m$" should read -- $(CH_2)_nO(CH_2)_m$ --.
Line 55, "acrylate" should read --methacrylate, acrylonitrile, isobornylmethacrylate, isobornyl acrylate,--.
Line 56, "acrylonitrile, isobornyl methacry-" should be deleted.
Line 57, "late, isobornyl methacrylate," should be deleted.

UNITED STATES PATENT AND TRADEMARK OFFICE
CERTIFICATE OF CORRECTION

PATENT NO. : 5,086,307

DATED : February 4, 1992

INVENTOR(S) : HIROMICHI NOGUCHI, ET AL.

It is certified that error appears in the above-identified patent and that said Letters Patent is hereby corrected as shown below:

COLUMN 31

Lines 65-68, "(C) a resin esterificated at part of epoxy groups present in an epoxy resin containing at least one compound having two or more epoxy groups in one molecule with an unsaturated carboxylic; and" should read --(C) an epoxy resin containing at least one compound having two or more epoxy groups in one molecule in which part of the epoxy groups are esterified with an unsaturated carboxylic acid; and--.

COLUMN 32

Line 12, "anyone" should read --any one--.
Line 13, "1 to 3" should read --1 or 2--.
Line 18, "anyone" should read --any one--.
Line 19, "1 to 4" should read --1 or 2--.

COLUMN 33

Line 3, "presented" should read --represented--.
Line 24, "$-CH_2)_nO-CH_2)_m$" should read --$(CH_2)_nO(CH_2)_m$--.
Line 42, "methacrylate" (both occurrences) should read --methacrylate,--.
Lines 54-57, "(C) a resin esterificated at part of epoxy groups present in an epoxy resin containing at least one compound having two or more epoxy groups in one molecule with an unsaturated carboxylic; and" should read --(C) an epoxy resin containing at least one compound having two or more epoxy groups in one molecule in which part of the epoxy groups are esterified with an unsaturated carboxylic acid; and--.

UNITED STATES PATENT AND TRADEMARK OFFICE
CERTIFICATE OF CORRECTION

PATENT NO. : 5,086,307
DATED : February 4, 1992
INVENTOR(S) : HIROMICHI NOGUCHI, ET AL.

It is certified that error appears in the above-identified patent and that said Letters Patent is hereby corrected as shown below:

COLUMN 34

Line 12, "anyone" should read --any one--.
Line 13, "16 to 18" should read --16 or 17--.
Line 14, "graftt" should read --graft--.
Line 17, "100:1 to 100:1." should read --100:1 to 100:10.--.
Line 18, "anyone" should read --any one--.
Line 19, "16 to 19" should read --16 or 17--.
Line 50, "olaim 27," should read --claim 27,--.

Signed and Sealed this

Twenty-eighth Day of June, 1994

Attest:

BRUCE LEHMAN

*Attesting Officer*    Commissioner of Patents and Trademarks